(12) United States Patent
Gorbachov

(10) Patent No.: US 8,467,738 B2
(45) Date of Patent: Jun. 18, 2013

(54) MULTI-MODE RADIO FREQUENCY FRONT END MODULE

(75) Inventor: Oleksandr Gorbachov, Irvine, CA (US)

(73) Assignee: RFaxis, Inc., Irvine, CA (US)

( * ) Notice: Subject to any disclaimer, the term of this patent is extended or adjusted under 35 U.S.C. 154(b) by 191 days.

(21) Appl. No.: 12/772,940

(22) Filed: May 3, 2010

(65) Prior Publication Data

US 2010/0277252 A1 Nov. 4, 2010

Related U.S. Application Data

(60) Provisional application No. 61/175,117, filed on May 4, 2009, provisional application No. 61/175,238, filed on May 4, 2009.

(51) Int. Cl.
*H04B 1/38* (2006.01)
(52) U.S. Cl.
USPC .................................. 455/73; 455/82; 455/83
(58) Field of Classification Search
USPC .................... 455/73, 82, 83, 103, 121, 127.3, 455/550.1, 553.1
See application file for complete search history.

(56) References Cited

U.S. PATENT DOCUMENTS

| | | | |
|---|---|---|---|
| 5,349,313 A | 9/1994 | Collins et al. | |
| 5,962,880 A | 10/1999 | Oda et al. | |
| 6,043,714 A | 3/2000 | Yamamoto et al. | |
| 6,108,313 A | 8/2000 | Lee et al. | |
| 6,154,664 A * | 11/2000 | Chorey et al. | 455/571 |
| 6,308,047 B1 | 10/2001 | Yamamoto et al. | |
| 6,313,699 B1 | 11/2001 | Nishijima et al. | |
| 6,469,587 B2 | 10/2002 | Scoggins | |
| 6,498,535 B1 | 12/2002 | Allen et al. | |
| 6,529,080 B1 | 3/2003 | Seymour et al. | |
| 6,556,075 B1 | 4/2003 | Jordan | |
| 6,690,238 B2 | 2/2004 | Lautzenhiser et al. | |
| 6,735,418 B1 | 5/2004 | MacNally et al. | |
| 6,771,475 B2 | 8/2004 | Leete | |
| 6,977,552 B2 | 12/2005 | Macedo | |
| 6,998,709 B2 | 2/2006 | Khorram | |
| 7,005,942 B2 | 2/2006 | Culliton et al. | |
| 7,120,427 B1 | 10/2006 | Adams et al. | |

(Continued)

FOREIGN PATENT DOCUMENTS

WO 2008/002697 3/2008

OTHER PUBLICATIONS

International Search Report; PCT/US2009/044524, Jul. 14, 2009, 10 pages.

(Continued)

*Primary Examiner* — Tuan H Nguyen
(74) *Attorney, Agent, or Firm* — Stetina Brunda Garred & Brucker

(57) ABSTRACT

A radio frequency (RF) front end circuit for connecting an antenna to a transceiver having multiple operating modes is disclosed. The circuit has a first transmit input receptive to signals of a first operating mode and a second operating mode from the transceiver. There is also a second transmit input receptive to signals of a third operating mode from the transceiver. The circuit has a first power amplifier for the first and second operating modes, a second power amplifier for the first operating mode, and a third power amplifier for the second and third operating mode. A first switch network selectively interconnects the first transmit input to a one of the second and third power amplifiers.

6 Claims, 13 Drawing Sheets

U.S. PATENT DOCUMENTS

| | | | |
|---|---|---|---|
| 7,256,665 | B2 | 8/2007 | Harris |
| 7,315,730 | B2 | 1/2008 | Galan |
| 7,373,171 | B2* | 5/2008 | Nakai ......................... 455/552.1 |
| 2003/0228848 | A1 | 12/2003 | Escoffier et al. |
| 2004/0204037 | A1* | 10/2004 | He et al. ..................... 455/553.1 |
| 2004/0209584 | A1 | 10/2004 | Bargroff et al. |
| 2004/0251960 | A1 | 12/2004 | Macedo |
| 2005/0009484 | A1 | 1/2005 | Imai et al. |
| 2005/0206456 | A1 | 9/2005 | Suzuki et al. |
| 2006/0035601 | A1 | 2/2006 | Seo |
| 2006/0068837 | A1 | 3/2006 | Malone |
| 2006/0270367 | A1 | 11/2006 | Burgener et al. |
| 2006/0290421 | A1 | 12/2006 | Ichitsubo et al. |
| 2007/0015472 | A1 | 1/2007 | Murtojarvi et al. |
| 2007/0161358 | A1* | 7/2007 | Bogdan ....................... 455/168.1 |
| 2007/0194859 | A1 | 8/2007 | Brobston et al. |
| 2007/0222697 | A1 | 9/2007 | Caimi et al. |
| 2007/0232241 | A1 | 10/2007 | Carley et al. |
| 2008/0089252 | A1 | 4/2008 | Choi |
| 2008/0159458 | A1 | 7/2008 | Cheng et al. |
| 2008/0182526 | A1 | 7/2008 | Moloudi et al. |
| 2008/0220826 | A1* | 9/2008 | Dagher et al. ................ 455/572 |
| 2008/0279262 | A1 | 11/2008 | Shanjani |
| 2009/0036065 | A1 | 2/2009 | Siu |

OTHER PUBLICATIONS

SiGe PA Enables Smallest System Footprint for Embedded WLAN; Semiconductor Online; Dec. 15, 2008; 3 pages.

WLAN & WiMAX from Sirenza: Sirenza Microdevices SZA Series Linear PAs for WiFi / WiBRO / WiMAX; 14 pages.

Skyworks: SKY65336: 2.4 GHz Transmit/Receive Front-End Module with Integrated LNA; Skyworks Solutions, Inc.; Aug. 20, 2008; 2 pages.

Skyworks; SKY65337: 2.4 GHz Transmit/Receive Front-End Module; Skyworks Solutions, Inc.; Aug. 20, 2008; 2 pages.

Skyworks; SKY65241-12: WLAN 802.11a, b, g, n Dual-Band Intera Front-End Module Single Antenna; Skyworks Solutions, Inc.; Mar. 12, 2008; 9 pages.

Skyworks; SKY65243-11: WLAN 802.11a, b, g, n Dual-Band Intera Front-End Module Dual Antennas; Skyworks Solutions, Inc.; Mar. 12, 2008; 8 pages.

Skyworks; SKY65256-11: WLAN 802.11a, b, g, n Dual-Band Front-End Module Single Antenna; Skyworks Solutions, Inc.; Sep. 28, 2007; 10 pages.

Skyworks; SKY65228-11: WLAN 802.11n Single Band 4.9-5.85 GHz MIMO Intera Front-End Module; Skyworks Solutions, Inc.; Oct. 9, 2007; 9 pages.

Skyworks; SKY65206-13: WLAN 802.11b/g Intera Front-End Module; Skyworks Solutions, Inc.; Aug. 21, 2007; 7 pages.

Skyworks; SKY65249-11: WLAN 802.11b, g, n Intera Front-End Module; Skyworks Solutions, Inc.; Nov. 30, 2007; 9 pages.

Skyworks; SKY65227-11: WLAN 802.11n Single Band Intera 2.4 GHz Mimo Intera Front-End Module; Skyworks Solutions, Inc.; Oct. 9, 2007; 9 pages.

International Search Report; PCT/US2009/051906; Oct. 15, 2009; 14 pages.

International Search Report; PCT/US2010/033593; Jul. 7, 2010; 17 pages.

International Search Report PCT/US2009/038621; Jul. 20, 2009.

International Search Report PCT/US2009/041834; Jun. 17, 2009.

ATMEL: Bluetooth Front-end IC T7024 Design Guide; Jun. 2004; 18 pages.

ATMEL: Integrated SiGe Front-end RF ICs;2003, 2 pages.

ATMEL: 5-GHz WLAN Power Amplifier for 802.11a, ATR3515 Preliminary; 2004, 7 pages.

ATMEL: High Gain Power Amplifier for 802.11b/g WLAN Systems, ATR7032 Preliminary; 2006, 15 pages.

ATMEL: ZigBee IEEE 802.15.4 Radio Transceiver; AT86RF230, Preliminary; 2007, 82 pages.

ANADIGICS: AWM6430; 3.5 GHz WiMAX Power Amplifier Module, Advanced Product Information—Rev. 0.1; Jan. 2005; 12 pages.

BROADCOM; BCM4328 Product Brief; Air Force One Single-Chip IEEE 802.11a/b/g MAC/Baseband/Radio With Integrated CPU; Dec. 5, 2006; 2 pages.

BROADCOM; BCM4326 Product Brief; Air Force One Single-Chip IEEE 802.11b/g MAC/Baseband/Radio With Integrated CPU; Dec. 5, 2006; 2 pages.

BROADCOM: BCM94318 Product Brief: Airforce One Chip 802.11 Reference Design; Oct. 7, 2004; 2 pages.

Xin He, Fully Integrated Transceiver Design in SOI Processes, a Dissertation, Kansas State University, 2004, 129 pages.

Schlegel, Gunther, Sr.; Improving Sensitivity of RF-Based AMI Front-End Systems; 16 pages.

MAXIM: Industry's First Ultra-Low-Power, 802.11g/b RF Transceiver to Integrate PA, Rx/Tx/Antenna Diversity Switches, and Crystal Oscillator Circuitry; Apr. 30, 2008; 2 pages.

MAXIM: MAX2830 Industry's First 802.11G/B RF Transceiver with Integrated PA, Rx/Tx and Antenna Switches; Apr. 30, 2008; 3 pages.

MESHNETICS: ZigBit Amp OEM Modules; ZDM-A1281-PN/PNO (MNZG-A24-UFL/UO) Revision 2.2; Ultra-Compact 2.4GHz 802 15.4/ZigBee Modules with Power Amplifier for Wireless Networking Applications; Oct. 2008, 18 pages.

MESHNETICS M2M-100-2008: ZigBit Amp Module; 2.4 GHz Amplified Modules for IEEE 802.15.4/ZigBee Wireless Mesh Networking Applications; 2 pages.

MESHNETICS: ZigBit Amp OEM Modules ZDM-A1281-PN/PNO Revision 2.1; Ultra-Compact 2.4GHz 802.15.4/ZigBee Modules with Power Amplifier for Wireless Networking Applications; Dec. 2007, 15 pages.

Murata MF2400PJ-SF0702; PA MMIC for 2.4GHz Wireless Communication; Jan. 18, 2003; 11 pages.

CEL California Eastern Laboratories: Class 1 Power Amplifiers for Bluetooth; 1 page.

CEL; GaAs Integrated Circuit PG2250T5N; 1.8 V, Power Amplifier for Bluetooth Class 1; NEC Electronics Corp.; 2006, 12 pages.

CEL NEC's Power Amplifier for Bluetooth Class 1: UPG2301TQ Data Sheet; Feb. 4, 2004; 7 pages.

CEL: GaAs HBT Integrated Circuit PG2314T5N: Power Amplifier for Bluetooth Class 1; Jul. 2006, 10 pages.

CEL Application Note: AN1048 UPG2150T5L Switch; Sep. 29, 2005, 1 page.

RFMD Preliminary: RF5263: 3.3V to 5.0V, 2.5GHz Linear Power Amplifier; pp. 7-31 to 7-32.

RFMD: RF5300: 3V, 5GHz Linear Power Amplifier pp. 2-655 to 2-660.

RFMD: RF5163: 3V-5V, 2.5 GHZ Linear Power Amplifier; pp. 2-627 to 2-638.

RFMD SiW1722B: Bluetooth Transceiver Solution for CDMA and WCDMA Mobile Phones; rfmd.com; 10-06; 2 pages.

RFMD RF5924 3.7V, Single-Band Front-End Module pp. 8-1 to 8-2.

RFMD RF5122 3V to 4.5V, 2.4GHz to 2.5GHz Linear Power Amplifier; 12 pages.

Richwave RTC6682 VO.3 Data Sheet Aug. 2006; www.richwave.com.tw; 7 pages.

WLAN WiMAX PA & FEM Market, Feb. 12, 2009; 158 page presentation.

Cirronet ZigBee High Power Module ZMN2405HP; Oct. 28, 2007; 6 pages.

Cirronet ZigBee High Power Module ZMN2430HP; Oct. 28, 2007; 6 pages.

Cirronet ZigBee Matching RF power performance to ZigBee apps—Electronic Products; 4 pages; http://www2.electronicproducts.com/PrintArticle.aspx?ArticleURL=cirronet.feb2006.html.

Design of a Dual Band Wireless LAN SiGe-Bipolar Power Amplifier; from Sep. 2004 High Frequency Electronics; 8 pages.

EPCOS WLAN Modules Preliminary Datasheet R041_M01; Jun. 20, 2006; 14 pages.

EMBER Datasheet; EM2420 2.4 GHz IEEE 802.15.4 / ZigBee RF Transceiver; Copyright 2003, 2004 by Ember Corporation; 89 pages.

Free2Move Class 1 Bluetooth Module—F2M03C1 Datasheet; Rev. Sep. 13, 2005; 46 pages.

Freescale Semiconductor Technical Data Document No. MC13191/D; Rev. 1.2 Apr. 2005; MC13191: 2.4 GHz ISM Band Low Power Transceiver; 24 pages.

Freescale Semiconductor Technical Data Document No. MC13192; Rev. 3.2 May 2007; MC13192: 2.4 GHz Low Power Transceiver for the IEEE 802.15.4 Standard; 24 pages.
Freescale Semiconductor; MC13191: 2.4 GHz Low Power Transceiver for the IEEE 802.15.4 Standard; Reference Manual; Document No. MC13191RM; Rev. 1.2; Apr. 2005; 92 pages.
Freescale Semiconductor Technical Data; Document No. MC13192; Rev. 2.8, Apr. 2005; MC13192/MC13193: 2.4 GHz Low Power Transceiver for the IEEE 802.15.4 Standard; 23 pages.
Freescale Semiconductor MC13192/MC13193: 2.4 GHz Low Power Transceiver for the IEEE 802.15.4 Standard; Reference Manual; Rev. 1.3 Apr. 2005; 111 pages.
California Eastern Laboratories: FreeStar ZFSM-100 Series ZigBee-Ready Modules; May 2008; 1 page.
California Eastern Laboratories; Apex ZAXM-201 Series ZigBee Pro-Ready Modules; CL596C.5.08; 1 page.
California Eastern Laboratories; Apex LT ZALM-301 Series ZigBee Pro-Ready Modules; CL596.LT.5.08; 1 page.
California Eastern Laboratories; ZIC2410 Datasheet; Rev. A; Document No. 0005-05-07-00-000; 119 pages.
CEL Preliminary Data Sheet; APEX & APEX LT Series Transceiver Modules; ZAXM-201-1, ZALM-301-1; May 7, 2008; 17 pages.
CEL Preliminary Data Sheet; Freestar Series Transceiver Module; ZFSM-101-1; May 7, 2008; 10 pages.
CEL Preliminary Data Sheet; Matrix Transceiver Modules; ZMXM-400 Series; May 7, 2008; 12.
J. Trachewsky, et al.; Broadcom WLAN Chipset for 802.11a/b/g; Broadcom Corporation, CA, USA; Aug. 17, 2003; 42 pages.
Anadigics; AWL6254; 1.4 GHz 802.11b/g/n; WLAN PA, LNA, and RF Switch Data Sheet—Rev 2.0; Feb. 2008; 16 pages.
ANADIGICS; AWM6430; 3.3-3.6 GHz Power Amplifier Module; Preliminary Data Sheet; Rev 1.0; Jan. 2006; 12 pages.
Hickman, Robert; ANADIGICS; A New Technology for WLAN Power Amplifiers; Warren NJ; 28 pages.
Zhang, Weimin; A Low Voltage Fully-Integrated 0.18um CMOS Power Amplifier for 5GHz WLAN; Institute of Microelectronics, Singapore; 2002; 4 pages.
Copeland, Miles A.; 5-GHz SiGe HBT Monolithic Radio Transceiver with Tunable Filtering; IEEE Transactions on Microwave Theory and Techniques, vol. 48 No. 2, Feb. 1000, 12 pages.
Atheros AR3011—ROCm Solutions for Bluetooth; Radio-On-Chip for Mobile (ROCm) Products; Jan. 22, 2008; 2 pages.
Atheros AR3000—ROCm Solutions for Bluetooth Radio-On-Chip for Mobile (ROCm) Products; Jan. 22, 2008; AR3031; 2 pages.
Atheros ROCm Platform; Radio-On-Chip for Mobile (ROCm); AR6001GL; Embedded 802.11b/g Solution for Mobile and Battery-Operated Devices; 2006; 2 pages.
AR6002 Breaking the Power Barrier in Mobile WiFi; Aug. 28, 2008; 2 pages.
AR6001GL; Embedded 802.11b/g Solution for Mobile and Battery-Operated Devices; 2006; 2 pages.
AR6001XL; Embedded 802.11a/b/g Solution for Mobile and Battery-Operated Devices; 2006; 2 pages.
AR6101G; World's Most Integrated, Cost-Effective Single-Chip WLAN Handset Design Brings Voice-Over-WiFi to the Mainstream; 2006; 2 pages.
AR9285 Single-chip PCIe based on 802.11n 1-stream specification; Oct. 28, 2008; 2 pages.
AR9002AP-1S; AP/Router solution based on 802.11n 1-stream specification; Oct. 28, 2008; 2 pages.
Fully-Integrated RF Transceiver System-on-Chip for ZigBee/IEEE 802.15.4 Applications Announced; California Eastern Laboratories, 2 pages.
Bluetooth RF Module RB06 Series for QUALCOMM Based Handsets, Kyocera, 4 pages.
How MLO Works the Power of Passive Components; JMD RF Made Simple: Jacket Micro Devices: Modules; copyright 2006 Jacket Micro Devices, Inc., 2 pages.
Skyworks; SKY65230-11: WLAN 802.11 n 2×2 MIMO Intera Front-End Module with 3 Antenna Ports; Skyworks Solutions, Inc.; Oct. 9, 2007; 13 pages.
Skyworks; SKY65225-11: WLAN 802.11n 2×2 MIMO Intera Front-End Module; Skyworks Solutions, Inc.; May 7, 2007; 11 pages.
Skyworks; SKY65135: WLAN Power Amplifier; Skyworks Solutions, Inc.; Mar. 26, 2007; 13 pages.
Skyworks; SKY65209: WLAN 802.11b/g Front-End Module ; Skyworks Solutions, Inc.; Jan. 18, 2006; 8 pages.
4.9-5.8 GHz High-Linearity Power Amplifier SST11LP11; SST Communications Corp; 2005, 14 pages.
4.9-5.8 GHz High-Linearity Power Amplifier SST11LP12; SST Communications Corp; 2005, 14 pages.
2.4 GHz Power Amplifier SST12LP00; SST Communications Corp; 2005, 9 pages.
2.4 GHz High-Linearity Power Amplifier SST12LP10; SST Communications Corp; 2005, 12 pages.
2.4 GHz Power Amplifier SST12LP14; SST Communications Corp; 2005, 12 pages.
2.4 GHz High-Power, High-Gain Amplifier SST12LP15; SST Communications Corp; 2005, 12 pages.
2.4 GHz High-Power, High-Gain Amplifier SST12LP15A; SST Communications Corp; 2005, 12 pages.
STLC2500C: Bluetooth EDR Single Chip Data Brief; STMicroelectronics; Jan. 2006, 4 pages.
STLC4550: Single Chip 802.11b/g WLAN radio Data Brief; STMicroelectronics; Feb. 2006, 5 pages.
ZigBee—compliant wireless control and sensoring network solutions; STMicroelectronics; Jun. 2006; 8 pages.
Amin, Yasar, et al; Integration of Passives for Receiver Front-End for 5GHz Wireless LAN Applications; Royal Institute of Technology, Sweden & U of Engineering & Tech, Taxila, Pakistan; p. 24-29, 2004.
Texas Instruments: CC2591; 2.4-GHz RF Front End, data sheet, Jun. 2008, Texas Instruments, Inc. 18 pages.
Texas Instruments: CC2436; High-Power Dual-Band (2.4-GHz and 4.9-GHz to 5.9-GHz) RF Front End, data sheet, May 2007; Texas Instruments, Inc. 15 pages.
Hoppenstein, Russell; High-Performance WiMAX RF Chipset Enable CPE and BTS Applications; Texas Instruments Inc.; Oct. 20, 2006.
Texas Instruments: Technology for Innovators: WiLink 4.0 single-chip mobile WLAN solutons Product Bulletin; 2006 Texas Instruments Inc., 2 pages.
Chipcon Products from Texas Instruments: CC2420; 2.4 GHz IEEE 802.15.4 / ZigBee-ready RF Transceiver; 2008, Texas Instruments Inc., 89 pages.
Chipcon Products from Texas Instruments: CC2430; A True System-on-Chip solution for 2.4 GHz IEEE 802.15.4 / ZigBee; 2007, Texas Instruments Inc., 212 pages.
Texas Instruments: CC2520 Datasheet; 2.4 GHz IEEE 802.15.4/SIZBEE RF Transceiver; Dec. 2007; Texas Instruments Inc.; 2007; 128 pages.
Zheng, Shaoyong, et al.; Distributed Power Amplifier/Feedback Low Noise Amplifier Switch-Less Front-End; Dept. Electronic Engineering, City University of Hong Kong, Feb. 8, 2006, p. 1659-1662.
Masse, Cecile; Analog/RF Front End; A direct-conversion transmitter for WiMAX and WiBro applications; www.rfdesign.com ; Jan. 2006, 3 pages.
XBEE OEM RF Modules; ZigBee / 802.15.4 OEM RF Modules by MaxStream, Inc. Specifications; MaxStream, Inc., 2005, 2 pages.
Fanucci, L, et al.; A Novel Fully Integrated Antenna Switch for Wireless Systems; Pisa, Italy, 4 pages, Sep. 16, 2003.
RFMD: Mobile Computing: Front End Module Portfolio; rfmd.com; 2009, 2 pages.
Maxim: Application Note 686; QPSK Modulation Demystified; May 1, 2002, 7 pages.
CEL California Eastern Laboratories: AN1049 UPG2314T5N HBT PA IC for Bluetooth and ZigBee; Oct. 17, 2006; 5 pages.
RT2501 Wireless Chipset 802.11 b/g solution featuring Packet-OVERDIRVE Technology; Ralink Technology Corp; 2006, 1 page.
RT2501U; USB2.0 Wireless Chipset 802.11 b/g solution featuring Packet-OVERDIRVE Technology; Ralink Technology Corp., 2006, 1 page.

RT2600 MIMO XR Wirless Chipset 802.11b/g solution featuring Packet-OVERDIRVE and Range-OVERDIRVE Technologies; Ralink Technology Corp; 2006, 1 page.

RT2700 MMO Wireless Chipset Family; 802.11n Solution featuring MIMObility Technology; Ralink Technology Corp; 2006, 2 pages.

RT2800 MIMO Wireless Chipset Family 802.11n Solution featuring MIMObility Technology; Ralink Technology Corp; 2006, 2 pages.

RT5201 Wireless Chipset 802.11 a/b/g solution featuring Packet-OVERDIRVE Technology; Ralink Technology Corp; 2006, 1 page.

RT5201U USB 2.0 Wireless Chipset 802.11 a/b/g solution featuring Packet-OVERDIRVE Technology; Ralink Technology Corp; 2006, 1 page.

RT5600 MIMO XR Wireless Chipset 802.11 a/b/g solution featuring Packet-OVERDIRVE and Range-OVERDIRVE Technologies; Ralink Technology Corp; 2006, 1 page.

Agnelli, Federico, et al; Wireless Multi-Standard Terminals: System Analysis and Design of a Reconfigurable RF Front-end; IEEE Circuits and Systems Magazine; First Quarter 2006; p. 38-59.

Cutler, Tim; ZigBee: RF power options in ZigBee solutions; Emerging Wireless Technology/A Supplement to RF Design; www.rfdesign.com; Mar. 2006; p. 18-21.

* cited by examiner

MULTI-MODE RADIO FREQUENCY FRONT END MODULE

CROSS-REFERENCE TO RELATED APPLICATIONS

This application relates to and claims the benefit of U.S. Provisional Application No. 61/175,117 filed May 4, 2009 and entitled "WCDMA-EDGE POWER AMPLIFIER ARCHITECTURES FOR MULTI-MODE HANDSET APPLICATIONS" and U.S. Provisional Application No. 61/175,238 filed May 4, 2009 and entitled "DUAL-POLE/DUAL THRU SWITCH CIRCUIT FOR MULTI-MODE WCDMA-EDGE HANDSET APPLICATIONS," the entire contents of which are wholly incorporated by reference herein.

STATEMENT RE: FEDERALLY SPONSORED RESEARCH/DEVELOPMENT

Not Applicable

BACKGROUND

1. Technical Field

The present invention relates generally to radio frequency (RF) devices. More particularly, the present invention relates to a multi-mode radio frequency front end module and associated switch circuitry.

2. Related Art

Wireless communications systems find application in numerous contexts involving data transfer over long and short distances alike, and there exists a wide range of modalities suited to meet the particular needs of each. Chief amongst these systems with respect to popularity and deployment is the mobile or cellular phone, and it has been estimated that there are over 4.6 billion subscriptions worldwide. Several different mobile phone technologies exist, including GSM (Global System for Mobile Communications), EDGE (Enhanced Data rates for GSM Evolution), and UMTS (Universal Mobile Telecommunications System). Even within the same carrier, different mobile technologies or different generations of one family of mobile technologies may be deployed from one locality to another, as base station equipment may be upgraded at uneven intervals. Accordingly, mobile phone handsets typically have the capability of utilizing diverse mobile technologies, also referred to as multi-mode.

A fundamental component of mobile handsets, or any wireless communications system for that matter, is the transceiver, that is, the combined transmitter and receiver circuitry. The transceiver, with its digital baseband subsystem, encodes the digital data to a baseband signal and modules it with an RF carrier signal. The modulation utilized for GSM is Gaussian minimum shift keying, while EDGE utilizes an 8 phase shift keying format. Upon receipt, the transceiver down-converts the RF signal, demodulates the baseband signal, and decodes the digital data represented by the baseband signal. An antenna connected to the transmitter converts the electrical signals to electromagnetic waves, and an antenna connected to the receiver converts the electromagnetic waves back to electrical signals. In almost all devices, whether single band or multiband, the transceiver is connected to a single antenna for size and cost reduction reasons.

Conventional mobile handset transceivers typically do not generate sufficient power or have sufficient sensitivity for reliable communications standing alone. Thus, additional conditioning of the RF signal is necessary. The circuitry between the transceiver and the antenna that provide this functionality is referred to as the front-end module, which include a power amplifier for increased transmission power, and/or a low noise amplifier for increased reception sensitivity. Various filter circuits such as band pass filters may also be included to provide a clean transmission signal at the antenna, and/or to protect the reception circuitry from external blocking signals reaching the antenna.

For multimode capabilities, particularly in relation to GSM-EDGE handsets, existing front end modules utilize a power amplifier specific to GSM for both GSM and EDGE. One power amplifier is fabricated on a single die for both GSM and EDGE due to size and cost constraints, even though EDGE has linear power requirements while GSM, by its nature, is non-linear. Therefore, substantial trade-offs are necessary to obtain both linear and non-linear performance from the single power amplifier. This mostly results in greater efficiency degradation in the EDGE mode, which may be below 25%. In comparison, efficiency in the GSM mode may be above 50%. Both of these efficiency measures are at a maximum rated output power, which is 30-33 dBm for GSM signals, and 26-27 dBm for EDGE signals. In actual operation, there may be further reductions in efficiency, in both EDGE and GSM modes, due to the power control modalities used, and the mobile nature of the handset, as different distances to base stations require different power outputs.

In addition to GSM and EDGE, conventional mobile handset transceivers also include W-CDMA or CDMA2k capabilities, which will be generally referred to as CDMA. These configurations include a separate power amplifier dedicated for CDMA. These multimode front end modules typically consist of two GSM-EDGE power amplifiers, two CDMA power amplifiers, and a single pole, seven terminal antenna switch module. Optionally, the CDMA power amplifier may include a DC-DC converter for increased efficiency.

As is understood, GSM-EDGE involves time-domain duplex (TDD), so transmit and receive channels utilize the same frequency while receiving and transmitting occur at different time intervals. Additionally, GSM-EDGE operates at two different frequency bands: low band, which by industry standards referred to as 850 MHz and 900 MHz, and a high band referred to as 1.8 GHz and 1.9 GHz. Accordingly, one of the GSM-EDGE power amplifiers is configured for the low bands of both GSM and EDGE, and the other of the GSM-EDGE power amplifiers is configured for the high bands of both GSM and EDGE. The GSM- and the EDGE-modulated RF signals are applied to a single pair of input lines of the integrated circuit.

GSM utilizes a constant envelope modulation scheme, and so the signal can pass through non-linear circuits without degrading the modulation information. Transmit power control is used to set an appropriate power level at the antenna for regulatory and battery conservation reasons. In most cases, for a GSM signal, a fixed RF power level is applied to the power amplifier, while power control is achieved by either adjusting the bias current or bias voltage. At medium and low power levels in GSM mode, battery consumption is reduced when the handset is in close proximity to a base station.

EDGE, however, utilizes a non-constant envelope modulation scheme, and the modulation information is highly degraded if the signal passes through non-linear circuit. Thus, as noted above, a linear power amplifier is necessary. Considering that GSM and EDGE modes share the same power amplifiers, back-off from saturated power helps achieve linear performance. To generate the appropriate power level, the input signal level to the power amplifier may be adjusted, or the bias current or the bias voltage can be adjusted.

Conventional multimode front end modules combine the two power amplifier outputs (high band/low band for a given mode) into a single antenna via a multi-port antenna switch module such as the single pole, seven position switch briefly mentioned above. GSM and EDGE received signals are passed through this switch and directed to the transceiver for further processing. The number of poles for the antenna switch is dependent on actual number of operating modes and frequencies and may differ from the seven mentioned above.

Besides the aforementioned configuration, more sophisticated architectures such as large signal polar loop may be employed, which utilizes highly efficient non-linear saturated power amplifiers for both GSM and EDGE signals. Despite improved battery consumption, circuit complexity of the transceiver and the front end module with such power amplifiers results in increased costs, and may find limited application only in high-end handsets.

CDMA also utilizes a non-constant envelope modulation scheme, so the standalone amplifiers typically employed in front end modules are linear. CDMA power amplifier efficiency is approximately 40% at maximum rated power, though it is possible to reach 50%. In order to maintain linear performance, RF isolators are typically connected to the power amplifier outputs based upon the assumption that there is a high antenna mismatch. An alternative solution is also often used without RF isolators while larger back-off from saturated power in this case results in lower efficiency. Unlike GSM and EDGE, CDMA mostly employs frequency domain duplex (FDD), meaning that transmission and reception operations are occurring simultaneously at different frequencies. The frequency difference can range between tens to several hundred MHz, so diplexers may be used. Furthermore, duplexers may be connected between the antenna and the power amplifier/low noise amplifier, and separate transmit and receive band pass filters may be employed.

The output power at the antenna may be adjusted by varying the power level of the RF signal to the CDMA power amplifier. Because the CDMA signal is continuous in the time domain, there is a large average current draw from the battery. In order to reduce power consumption, varying control modalities have been conceived, including adjustment of bias voltage and/or current, changing the power amplifier output matching network, and activating/deactivating certain power amplifier stages.

Due to these inherent operational incompatibilities, GSM/EDGE front end modules are fabricated as one module, and the CDMA front end modules are fabricated as a different module. The GSM/EDGE front end modules may be fabricated on a single chip, sometimes in conjunction with the antenna switch. As noted above, there are significant deficiencies with respect to the power/efficiency characteristics of such conventional front end modules. For efficient power control in either GSM-EDGE mode or CDMA mode, conventional devices utilize complicated transmit detector circuits in each transmit chain, as well as additional low pass or harmonics rejection filters. Accordingly, there is a need in the art for an improved multi-mode radio frequency front end module.

BRIEF SUMMARY

In accordance with one embodiment of the present disclosure, a radio frequency (RF) front end circuit is contemplated. The front end circuit may connect an antenna to a transceiver having a first operating mode, a second operating mode, and a third operating mode. There may be a first set of transmit ports receptive to signals of the first operating mode and the second operating mode from the transceiver. Additionally, there may be a second set of transmit ports receptive to signals of the third operating mode from the transceiver. The front end circuit may include a first set of power amplifiers for the first operating mode and a second set of power amplifiers for the second and third operating modes. There may be a first switch that selectively interconnects a one of the first set of transmit ports to a one of the first set of power amplifiers and a one of the second set of power amplifiers. Furthermore, there may be a second switch that selectively interconnects a different one of the first set of transmit ports to a different one of the first set of power amplifiers and a different one of the second set of power amplifiers.

According to another embodiment, there is provided an RF front end circuit for connecting an antenna to a transceiver having a first operating mode, a second operating mode, and a third operating mode. The front end circuit may include a first transmit input receptive to signals of the first operating mode and the second operating mode from the transceiver. Along these lines, there may be a second transmit input receptive to signals of the third operating mode from the transceiver. The front end circuit may include a first power amplifier for the first and second operating mode, a second power amplifier for the first operating mode, and a third power amplifier for the second and third operating mode. There may be a first switch network that selectively interconnects the first transmit input to a one of the second and third power amplifiers.

In accordance with yet another embodiment, there is contemplated a switching module for interconnecting a transceiver with at least two outputs to respective amplifiers having each outputs connectible to an antenna. The switching module may also include a first transmit input port connectible to the transceiver, as well as a second transmit input port connectible to the same. A first switch network may selectively interconnect the first and second transmit input ports to a first one of the amplifiers. Additionally, a second switch network may selectively interconnect the first switch network to a second one of the amplifiers. A third switch network may further selectively interconnect the first one of the amplifiers and the second switch network to the antenna.

The present disclosure also contemplates a front end circuit for connecting an antenna to a transceiver having a GSM (Global System for Mobile Communications) operating mode, an EDGE (Enhanced Data rates for GSM Evolution) operating mode, and a CDMA operating mode. The front end circuit may include a combined GSM and EDGE signals transmission port and a CDMA signals transmission port. Furthermore, the front end circuit may include a GSM amplifier circuit having non-linear operational characteristics and a CDMA amplifier circuit having linear operational characteristics. There may also be included a switch network that selectively interconnects the combined GSM and EDGE signals transmission port to the CDMA amplifier circuit and to the GSM amplifier circuit. A multi-position switch that interconnects a selected single one of the GSM amplifier circuit and the CDMA amplifier circuit to the antenna may also be included.

In another embodiment, an RF switch circuit is contemplated. The circuit may include a combination input port that is receptive to first and second operating mode signals. There may also be a single input port that is receptive to third operating mode signals, as well as a single output port for the first operating mode signals. A combination output port may be provided for the second and third operating mode signals.

The switch circuit may also include a switching network with one or more control lines that selectively connect the combination input port to the combination output port. The switch circuit may also selectively connect the single input port to the combination output port, as well as the combination input port to the single output port. The connections of the switching network may be selectable by an activation the one or more control lines.

Various embodiments of the present disclosure also provide an active switching circuit with first and second input ports, as well as first and second output ports. The circuit may include a first amplifier segment with a first transistor. The first transistor may have a base, a collector and an emitter, with the base being connected to the first input port and a first control line. The circuit may also include a second amplifier segment. This segment may include a second transistor that has a base, a collector, and an emitter. The base may be connected to a second control line, and the collector may be connected to a third control line and the first output. The emitter may be connected to the collector of the first transistor. The second amplifier segment may further include a third transistor with a base connected to a third control line, a collector, and an emitter. This emitter may be connected to the emitter of the second transistor and the collector of the first transistor. Additionally, there may be a fourth transistor with a base, a collector, and an emitter. The base may be connected to the collector of the third transistor, the base of the third transistor, and the third control line. The emitter may be connected to the second output port. In addition to the second amplifier segment, there may be a third amplifier segment with a fifth transistor. The fifth transistor may have a base, a collector, and an emitter. The base may be connected to the first input port and a fourth control line, and the collector may be connected to the second output port.

The present invention will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which.

Common reference numerals are used throughout the drawings and the detailed description to indicate the same elements.

DETAILED DESCRIPTION

The detailed description set forth below in connection with the appended drawings is intended as a description of certain embodiments of the present disclosure, and is not intended to represent the only forms that may be developed or utilized. The description sets forth the various functions in connection with the illustrated embodiments, but it is to be understood, however, that the same or equivalent functions may be accomplished by different embodiments that are also intended to be encompassed within the scope of the present disclosure. It is further understood that the use of relational terms such as top and bottom, first and second, and the like are used solely to distinguish one entity from another without necessarily requiring or implying any actual such relationship or order between such entities.

Figure 1:
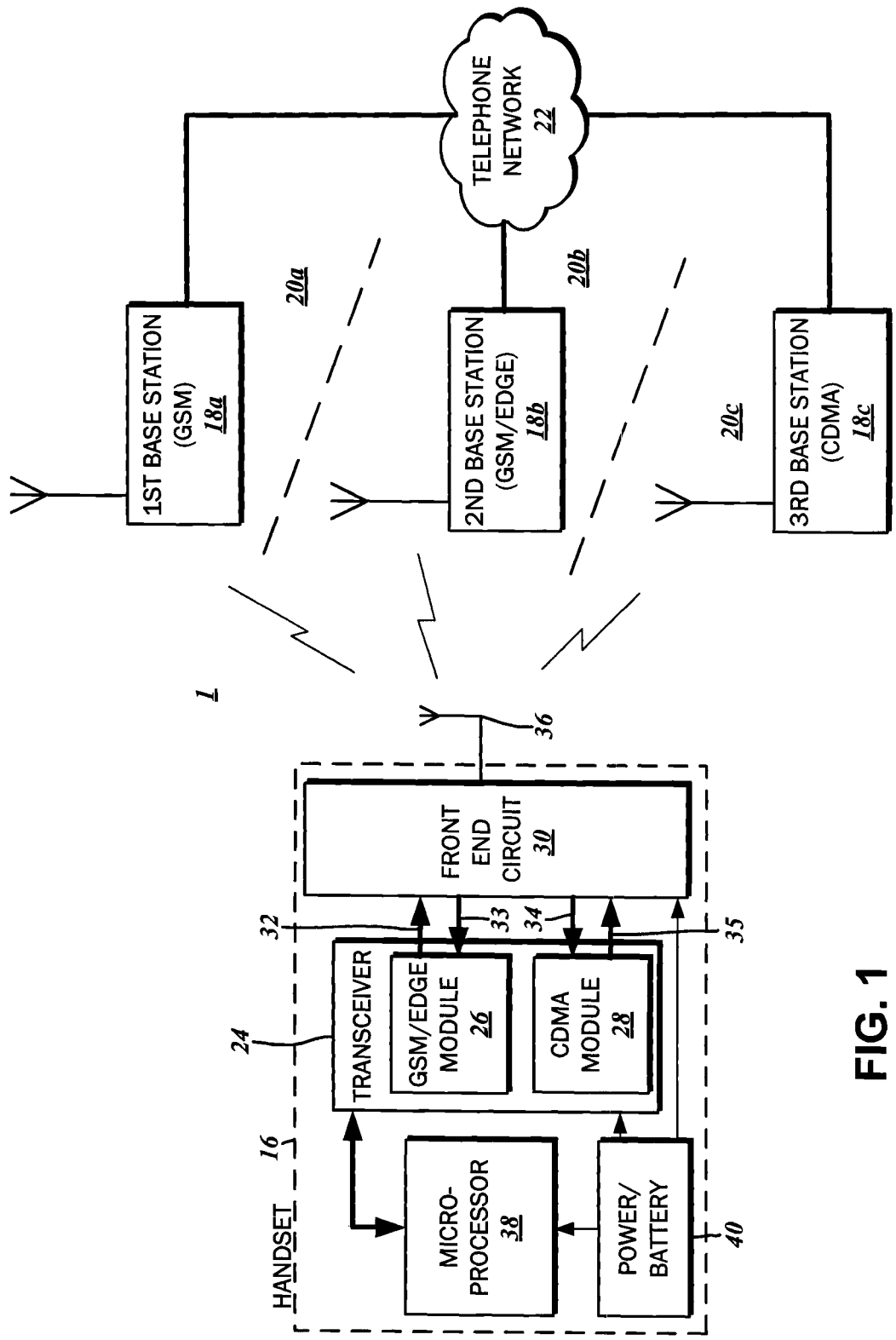
FIG. 1 is a block diagram illustrating the components of a multimode radio frequency (RF) transceiver and front end circuit operating as a cellular phone handset in an exemplary environment.

In FIG. 1, there is illustrated an exemplary cellular phone environment 1 in which various embodiments of the present disclosure may be implemented. At the most basic level, the environment 1 includes one or more handsets 16 that are carried by a user. The handsets 16 transmit signals to and receive signals from various base stations 18a-c. Per conventional cellular telephone network implementations, signal transmission limitations dictate that each of the base stations 18a-c are capable of exchanging communications with the handset 16 only within the respective geographic areas 20a-c. As the user physically traverses the geographic areas 20, it is possible for the handset 16 to transition seamlessly from one base station 18 to another. The base stations 18 may be connected to a central telephone network 22 where calls and other data are further routed to specified destinations.

The base stations 18a-c are designated in accordance with the wireless communications modality/standard particular thereto. The first base station 18a is for Global System for Mobile communications (GSM) only, while the second base station 18b is for Enhanced Data Rates for GSM Evolution (EDGE). It is understood that EDGE is backwards compatible with GSM, so EDGE networks can also be used for GSM communications. The third base station 18c is designated for CDMA communications. As utilized herein, any reference to CDMA is understood to be to the family of 3G mobile technology standards also known as IMT Multi-Carrier, which include the CDMA2000, W-CDMA, and cdmaOne standards, rather than the channel access method known as code division multiple access. The operational characteristics of these wireless communication standards have been discussed previously.

As with any communications system, the cellular phone system utilizes a transmitter to generate radio frequency (RF) signals that are broadcasted and subsequently received by the base station 18, and a receiver to detect RF signals that are broadcast by the base station 18. These two functions are typically combined into a transceiver 24, which has a GSM/EDGE module 26 for communicating with corresponding GSM or EDGE base stations such as the first base station 18a and the second base station 18b, and a CDMA module 28 for communicating with corresponding CDMA base stations such as the third base station 18c. As noted above, the circuitry of the transceiver 24 itself typically does not generate sufficient power for transmission to distant base stations 18, nor have sufficient sensitivity to receive signals from the same. Accordingly, the handset 16 includes a front end circuit 30 that includes one or more power amplifiers in the transmit (TX) chain, and one or more low noise amplifiers in the receive (RX) chain. Because the signal characteristics of GSM/EDGE signals and CDMA signals differ in several significant regards as explained above, the front end circuit 30 may have separate power amplifiers and low noise amplifiers for each. To this end, the GSM/EDGE module 26 has an independent transmit line 32 and receive line 33, and the CDMA module has a separate independent transmit line 34 and receive line 36 that interconnect the transceiver 24 to the front end circuit 30. The front end circuit 30 is connected to an antenna 36 that propagates the electromagnetic RF signals. Despite having separate transmission and receive lines, a single antenna 36 is typically employed in the handset 16 for size-reduction reasons.

In addition to the basic transceiver 24, the handset 16 includes several other components for user interfacing and supplemental functionality. For instance, higher level functions such as call management (initiate, maintain, and terminate calls), contact management, and the like are performed by an embedded microprocessor 38 based upon programmed sets of instructions that are executed thereby. There may also be audio amplifier circuits and transducers, as well as keypad controllers and the like (none of which are shown in FIG. 1 for clarity purposes). Power to the transceiver 24, the front end circuit 30, and the microprocessor 36 are provided by an on-board battery 40. The limited energy capacity of the battery 40 places substantial constraints on the design and configuration of every component utilized in the handset 16, and as will become more apparent below, particularly with the front end circuit 30.

The cellular phone environment 1 is presented by way of example only and not of limitation, and only for the limited purpose of showing one context where one or more of the embodiments of the disclosure are utilized. Similarly, the particulars of the handset 16 are likewise presented by way of example only, and any other suitable configuration may be substituted.

Figure 2:
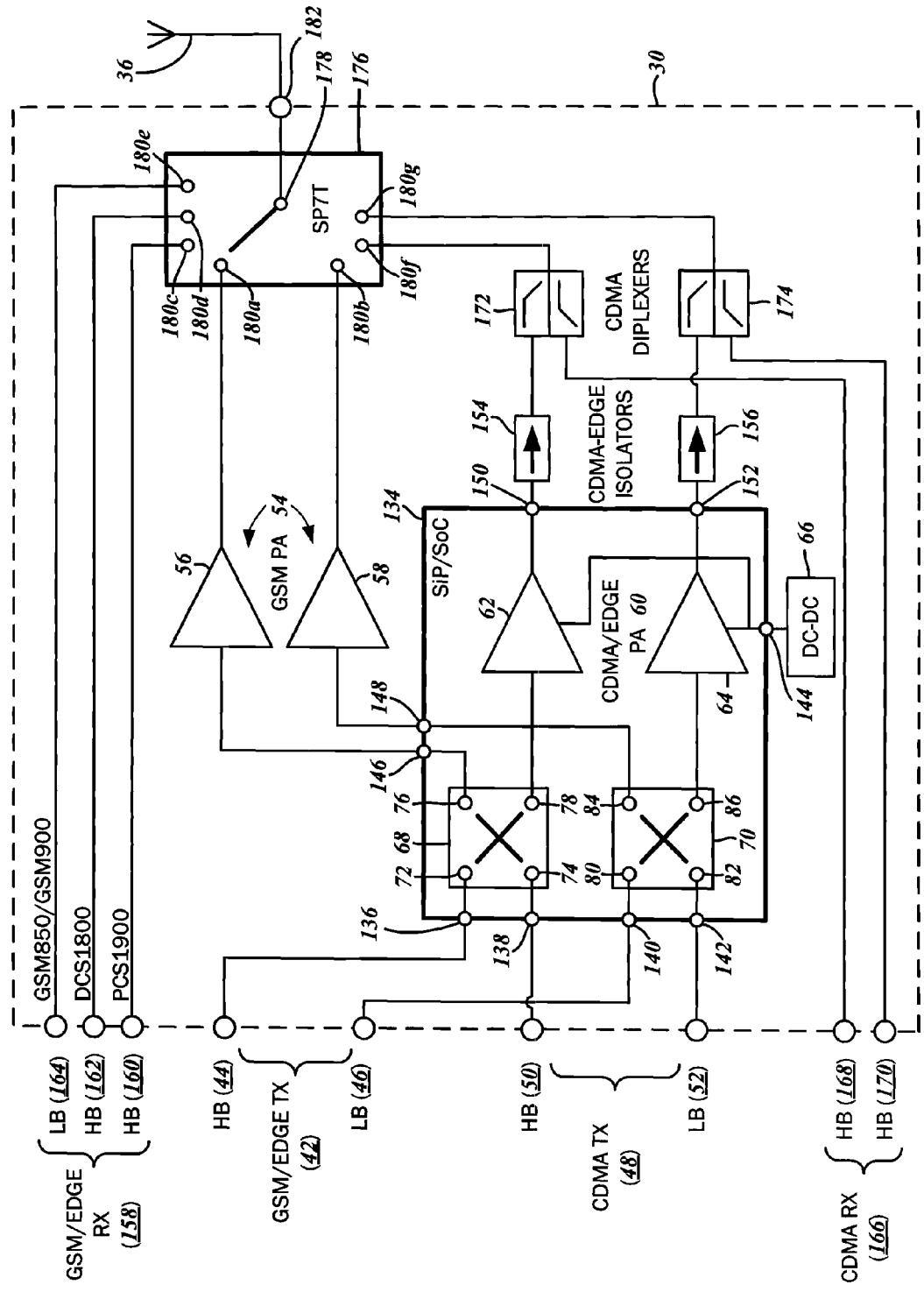
FIG. 2 is a circuit schematic diagram of the front end circuit in accordance with one embodiment of the present disclosure.

The circuit schematic of FIG. 2 illustrates the RF front end circuit 30 or module in accordance with one embodiment of the present disclosure. As set forth above, the front end circuit 30 interconnects the antenna 36 to the transceiver 24. It is understood that the transceiver 24 has a first operating mode that may correspond to the GSM communications mode, a second operating mode that may correspond to the EDGE communications mode, and a third operating mode that may correspond to the CDMA communications mode. The front end circuit 30 has a first set of transmit ports 42 or inputs that are receptive to GSM signals and EDGE signals from the transceiver 24. The first set of transmit ports 42 may also be referred to as the GSM/EDGE transmit ports, for the communications mode of which signals it carries. Also referring to FIG. 1, the first set of transmit ports 42 may be connected to the transmit line 32. In some embodiments, the constituent ports of the GSM/EDGE transmit ports 42 include a high band port 44 and a low band port 46. As indicated above, EDGE high band operates in the 1.8 GHz and 1.9 GHz frequency bands, and are also referred to as DCS1800 and PCS1900, respectively. EDGE low band operates in the 850 MHz and 900 MHz frequency bands.

The front end circuit 30 further has a second set of transmit ports 48 or inputs that are receptive to CDMA signals from the transceiver 24. The second set of transmit ports 48 may also be referred to as the CDMA transmit ports, for the communications mode of which signals it carries. The second set of transmit lines 34 may be connected to the second transmit ports 48. The constituent ports of the CDMA transmit ports 48 similarly include a high band port 50 and a low band port 52.

Generally, various embodiments of the present disclosure contemplate amplifying the GSM signal with a dedicated GSM power amplifier, amplifying the EDGE signal with a CDMA power amplifier, and amplifying a CDMA signal with the CDMA power amplifier. It is understood that the linear operational characteristics and comparable output power levels of the CDMA power amplifier render it particularly suitable, with some tuning, for EDGE signals. On the other hand, GSM requires non-linear operational characteristics. In further detail, the front end circuit 30 includes a first set of power amplifiers 54 that may be specific to GSM signals. Accordingly, these may also be referred to as GSM power amplifiers. Corresponding to the two GSM transmit ports 42, there may be a first GSM power amplifier 56 and a second GSM power amplifier 58. The front end circuit 30 also includes a set of power amplifiers 60 that may be specific to the CDMA and EDGE signals, and are correspondingly referred to as CDMA/EDGE power amplifiers. Again, to match with the two CDMA ports 48, there may be a first CDMA power amplifier 62 and a second CDMA power amplifier 64. The CDMA power amplifiers 60 may each be supplied power from a DC-DC converter 66, which may already be included in existing handsets 16 with CDMA power amplifiers. It is understood that current consumption is further reduced, particularly in the EDGE operation mode.

One embodiment contemplates a first switch 68 and a second switch 70 that selectively makes the appropriate connections between the GSM/EDGE transmit ports 42 and the CDMA transmit ports 48, and the GSM power amplifiers 54 and the CDMA/EDGE power amplifiers 60 to provide the aforementioned functionality. The control signals for the switches 68, 70 are from those existing in the conventional transceiver 24, specifically, the baseband mode control and enable signals. The first switch 68 and the second switch 70 are understood to be of the double pole, double throw (DPDT) type, the details of which will be discussed more fully below. According to various embodiments, the first switch 68 and the second switch 70 may have a signal power loss between 0.5 dB and 0.7 dB, depending on the configuration.

The first switch 68 selectively interconnects the GSM/EDGE high band port 44 to the first GSM power amplifier 56 and the first CDMA/EDGE power amplifier 62. Additionally, the first switch 68 selectively interconnects the CDMA high band port 50 to the first CDMA/EDGE amplifier 62. Although a connection can be made between the CDMA high band port 50 and the first GSM power amplifier 56 when the GSM/EDGE high band port 44 is connected to the first CDMA/EDGE power amplifier 62, the CDMA mode and the EDGE mode are not simultaneously operating because of time domain sharing. In further detail, the first switch 68 includes a first port 72 (input) that is tied to the GSM/EDGE high band port 44, a second port 74 (input) that is tied to the CDMA high band port 60. There is also a third port 76 (output) tied to the first GSM power amplifier 56, and a fourth port 78 (output) tied to the first CDMA/EDGE power amplifier 62.

The second switch 70 selectively interconnects the GSM/EDGE low band port 46 to the second GSM power amplifier 58 and the second CDMA/EDGE power amplifier 64. The second switch also selectively interconnects the CDMA low band port 52 to the second CDMA/EDGE power amplifier.

Again, although the second switch can make a connection between the CDMA low band port 52 to the second GSM power amplifier 58, there are no CDMA signals being passed there through. The second switch 70 includes a first port 80 (input) that is tied to the GSM/EDGE low band port 46, a second port 82 (input) that is tied to the CDMA low band port 60. Furthermore, there is a third port 84 (output) tied to the second GSM power amplifier 56, and a fourth port 86 (output) tied to the second CDMA/EDGE power amplifier 64.

Figure 3:
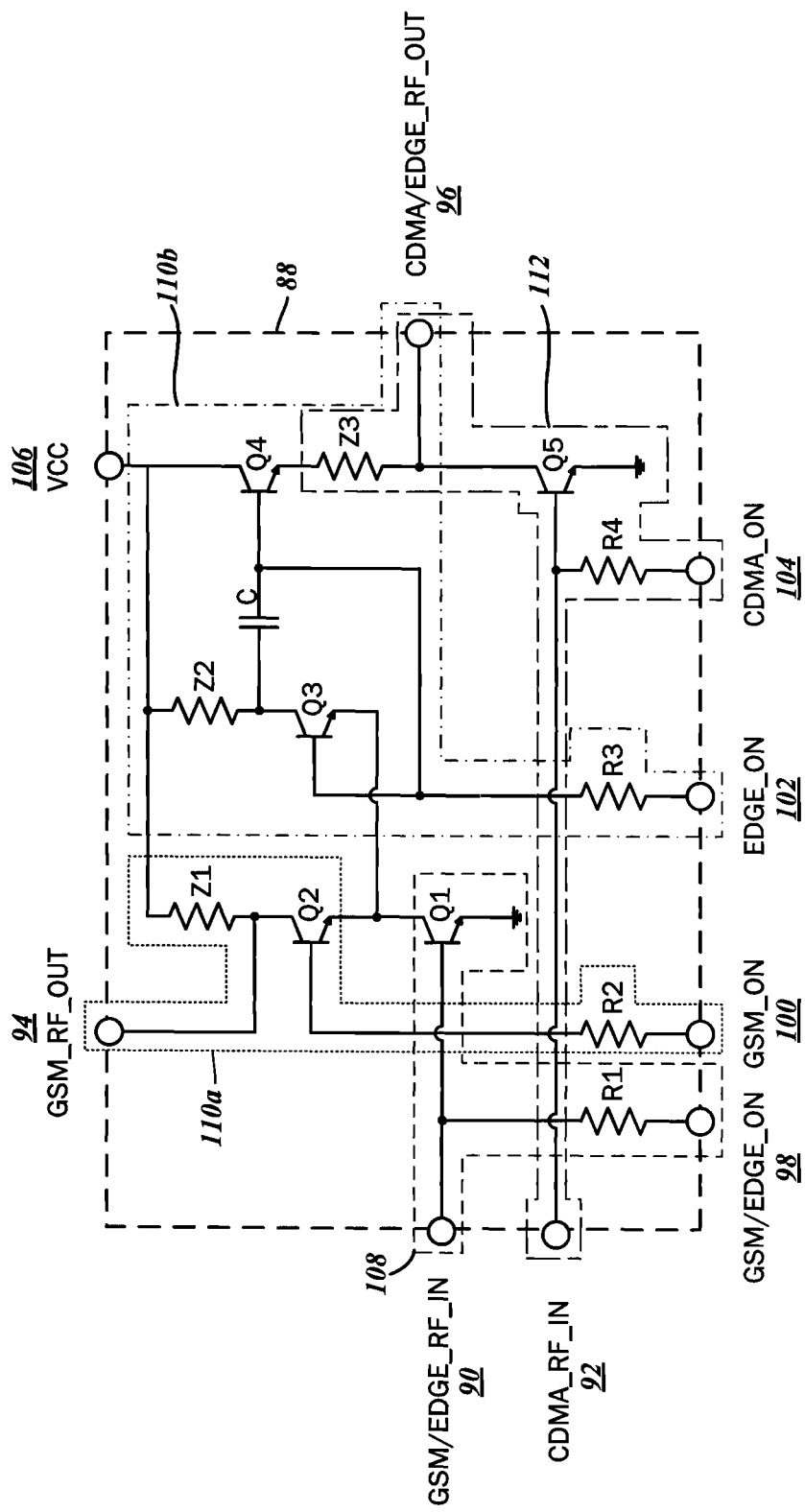
FIG. 3 is generalized circuit schematic diagram of a switch utilized in the front end circuit.

Having considered the general functionality of the first switch 68 and the second switch 70, additional details regarding the circuits thereof will now be discussed. For purposes of the following, the first switch 68 and the second switch 70 are understood to be identical, and will be referenced in unison as a switch circuit 88 or switching network depicted in FIG. 3. The switch circuit 88 has two RF signal inputs, referenced as input GSM/EDGE_RF_IN 90, as well as input CDMA_RF_IN 92. These inputs are understood to correspond to the first ports 72, 80 and second ports 74, 82 of the first and second switches 68, 70, respectively. The input GSM/EDGE_RF_IN 90 may be referred to as a combination input port as being associated with signals of a combination of modes, while the input CDMA_RF_IN 92 may be referred to a single input port as being associated with signals of a single mode. The switch circuit 88 also has two RF signal outputs, referenced as output GSM_RF_OUT 94, as well as output CDMA/EDGE_RF_OUT 96 that correspond to the third ports 76, 84 and fourth ports 78, 86 of the first and second switches 68, 70, respectively. The output GSM_RF_OUT 94 may also be referred to as a single output port as being associated with signals of a single mode, and the output CDMA/EDGE_RF_OUT 96 may also be referred to as a combination output port as being associated with signals of multiple modes. When either of the outputs is not activated, the configuration of the switch circuit 88 is such that there is minimal leakage of RF power there from. In addition to the RF signal inputs and outputs, the switch circuit has four control inputs referenced as GSM/EDGE_ON 98, GSM_ON 100, EDGE_ON 102, and CDMA_ON 104, as well as a single bias supply line VCC 106. Each of these control inputs will be discussed further, in turn.

The switch circuit 88 may be generally segregated into a first amplifier segment 108, a second amplifier segment 110 including a first stage 110*a* and a second stage 110*b*, and a third amplifier segment 112. The first amplifier segment 108 includes a transistor Q1 in a common emitter configuration with a base that is connected to the input GSM/EDGE_RF_IN 90, as well as the control input GSM/EDGE_ON 98. Specifically, the transistor Q1 is activated by the control input GSM/EDGE_RF_IN 90, with the bias point being set by a resistor R1. The second amplifier segment 110, and specifically the first stage 110*a* thereof that includes a transistor Q2, is connected to the first amplifier segment 108. Additionally, the first stage 110*a* is connected to the output GSM_RF_OUT 94 that is output-matched with a matching circuit Z1, and is activated by the control input GSM_ON 100. The bias point for the transistor Q2 is set by a resistor R2. The second stage 110*a* of the second amplifier segment is also connected to the first amplifier segment 108 and includes a transistor Q3 and a transistor Q4 that are both activated or biased on by control input EDGE_ON 102. The bias points of transistor Q3 and Q4 are set by a resistor R3, and capacitor C is understood to provide DC-decoupling. The second stage 110*a* also includes matching circuits Z2 and Z3 for output matching, in combination, to the output CDMA/EDGE_RF_OUT 96. The third amplifier segment 112 is connected to the input CDMA_RF_IN 92 and includes a transistor Q5 that is biased on by the control input CDMA_ON 104. The transistor Q5 is also connected to the output CDMA/EDGE_RF_OUT 96, with output matching provided by the matching circuit Z3. The transistor Q5 is turned on by activating the control input CDMA_ON 104, with a bias point being set by a resistor R4. In addition to the output matching circuits Z1-Z3, it is expressly contemplated that there be input matching circuits for the inputs GSM/EDGE_RF_IN 90 and the CDMA_RF_IN 92, but have been omitted from FIG. 3.

As can be discerned from the foregoing, the control lines GSM/EDGE_ON 98, GSM_ON 100, EDGE_ON 102, and CDMA_ON 104 are used to control the on and off states of the various transistors Q1-Q5 and its corresponding amplifier segments. Generally, the control lines selectively connect the combination input port 90 to the combination output port 96, the single input port 92 to the combination output port 96, and the combination input port 90 to the single output port 94.

More particularly, when a GSM signal is provided to the input GSM_EDGE_RF_IN 108 and the control lines GSM_EDGE_ON 98 and GSM_ON 100 are activated, transistors Q1 and Q2 are turned on, while transistors Q3, Q4 and Q5 are turned off. The signal is amplified to a certain level and passed to the output GSM_RF_OUT 94, with the gain being defined by setting bias points for the transistors Q1 and Q2 along with the matching circuit Z1.

When a CDMA signal is applied to input CDMA_RF_IN 92, and the control line CDMA_ON 104 is activated, the transistors Q4 and Q5 are turned on while the transistors Q1, Q2, and Q3 are turned off. The signal is amplified to a certain level and passed to the output CDMA/EDGE_RF_OUT 96, with the gain being defined by setting the bias points for the transistors Q4 and Q5 along with the matching circuit Z3. Approximately 20 dB to 30 dB of attenuation of the CDMA signal can be achieved at the output CDMA/EDGE_RF_OUT 96 when one or both of the transistors Q4 and Q5 are turned off while zero current is drawn from the battery 40, and as such, may be suited for power control in the CDMA operating mode.

When an EDGE signal is applied to the input GSM/EDGE_IN 90, the transistors Q1 and Q3 are turned on based upon the activation of the control lines GSM/EDGE_ON 98 and EDGE_ON 102, and the transistor Q4 is turned off. The transistor Q4 may be turned on and Q5 may be turned off, or both of the transistors Q4 and Q5 may be turned off. There is low insertion loss with respect to a signal applied to the base of the transistor Q4 (typically below 2 dB) with zero current draw from the battery 40, while the input P1 dB at the base of the transistor Q4 is large (typically above 20 dBm). A total gain is defined by the transistors Q1 and Q3 and Q4 as well as the output matching circuits Z2 and Z3. It is possible to adjust the gain parameters to obtain a power level suitable for EDGE communications. Few decibels of additional attenuation, typically around 5 dB, occurs when the transistor Q4 is turned off and the transistor Q5 is turned on while there is zero current drawn. It is contemplated that this can be applied to power utilization control in the EDGE mode.

Figure 4:
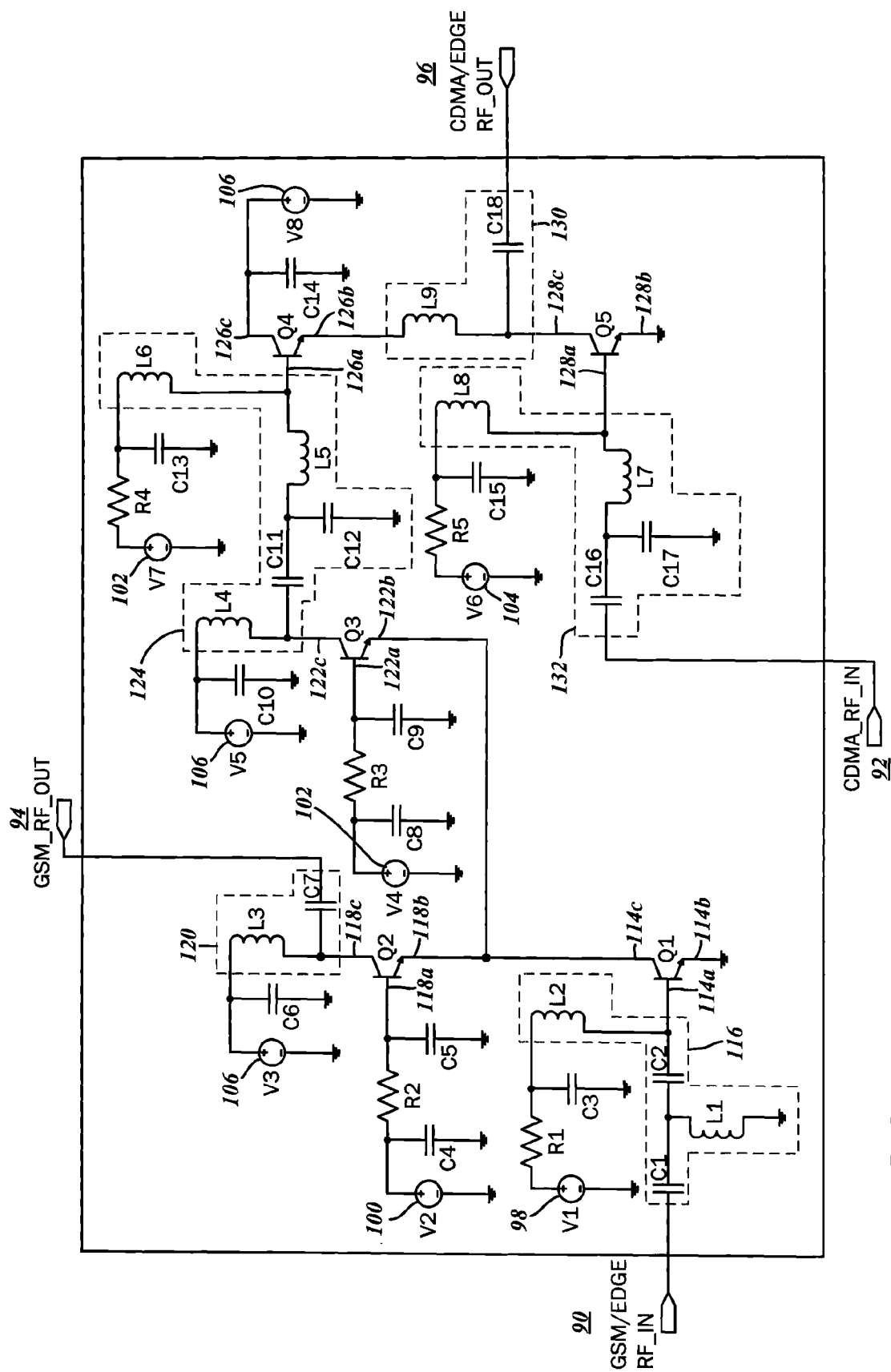
FIG. 4 is a detailed circuit schematic diagram of the switch in accordance with one particular embodiment.

The detailed circuit schematic diagram of FIG. 4 illustrates a specific embodiment of the switch circuit 88 that corresponds to the more generalized description of the same, above. Again, the switch circuit 88 has the inputs GSM/EDGE_RF_IN 90 and CDMA_RF_IN 92, and the outputs GSM_RF_OUT 94 and CDMA/EDGE_RF_OUT 96. The first amplifier segment 108 includes the transistor Q1 in a common emitter configuration. The transistor Q1 has a base 114*a* that is tied to the input GSM/EDGE_RF_IN 90, and as indicated above, defines a common input stage for the GSM/EDGE signal. The base 114*a* and the input GSM/EDGE_R-

F_IN 90 are connected to an input matching circuit 116 that includes capacitors C1 and C2 and inductors L1 and L2. The values of these components are set so that the input GSM/EDGE_RF_IN 90 is matched to the transceiver 24 while the transistors Q1 and Q2 or transistor Q3 are on. An adjustable voltage source V1 turns on and off the transistor Q1, and sets the bias point for the same with the resistor R1, which is connected to the base 114*a* through the inductor L2. In this regard, the voltage source V1 corresponds to the control input GSM/EDGE_ON 98. A capacitor C3 serves as an RF decoupling element, and has a high enough capacitance such that the voltage source V1 is adequately RF-decoupled from the rest of the switch circuit 88.

As indicated above, the first amplifier segment 108 is connected to the second amplifier segment 110 that includes the transistor Q2. In further detail, the transistor Q2 is connected to the transistor Q1 in a cascode configuration, that is, an emitter 118*b* of the transistor Q2 is connected to the collector 114*c* of the transistor Q1. It is understood that the transistor Q2 is part of the dedicated amplifier stage for the GSM signal. The collector 118*c* of the transistor Q2 is connected to an output matching circuit 120, which in turn is connected to the output GSM_RF_OUT 94. The output matching circuit 120 includes an inductor L3 and a capacitor C7, and values therefor are selected such that the output GSM_RF_OUT 94 is matched with a subsequent power amplifier in the GSM transmit chain, which typically has an impedance of 50 ohm. The output matching circuit 120 is understood to correspond to the matching circuit Z1 discussed above. A voltage source V3 is applied to the collector 118*c* of the transistor Q2 through an inductor L3 to bias the same, and is understood to correspond to the VCC 106. A capacitor C6 having sufficient capacitance to RF-decouple the voltage source V3 is connected thereto as well as the output matching circuit 120. A voltage source V2 is applied to the base 118*a* of the transistor Q2 to turn it on, and set its bias point through a resistor R2. This input is understood to correspond to the control line GSM_ON 100. A capacitor C4 is selected with a value sufficiently high to RF-decouple the voltage source V2 from the rest of the switch circuit 88, and a capacitor C5 is connected to the transmit chain for stabilization and gain shape adjustment over a desired frequency range.

The second amplifier segment 110 also includes the transistor Q3 that is in a cascode configuration with the transistor Q1, that is, an emitter 122*b* of the transistor Q3 is connected to the collector 114*a* of the transistor Q1. This segment of the switch circuit is understood to be the dedicated stage for the EDGE signal. A bias voltage source V5 is applied to the collector 122*c* of the transistor Q3 through an inductor L4, and is understood to correspond to VCC 106. A capacitor C10 is selected with a high enough value to RF-decouple the voltage source V5 from the rest of the circuit. Furthermore, the base 122*a* of the transistor Q3 is connected to a voltage source V4 that turns on and turns off the transistor Q3. The voltage source V4 also sets the voltage bias for the transistor Q3 in conjunction with the resistor R3. This is understood to correspond to the control line EDGE_ON 102. A capacitor C8 is selected with a value sufficiently high to RF-decouple the voltage source V4 from the rest of the circuit, and a capacitor C9 is selected to stabilize and control gain shape over a desired frequency range. The impedance at the collector 122*c* of the transistor Q3 that is turned on is matched to the impedance at the base 124*a* of the transistor Q4 with a matching circuit 126 including inductors L4, L5, and L6, and capacitors C11 and C12.

The transistor Q4 is contemplated to serve as a DC bias switch for the transistor Q5, with the base-emitter junction serving as a low-loss RF signal pass for the EDGE signal to the output CDMA/EDGE_RF_OUT 96. A base 126*a* of the transistor Q4 is connected to the matching circuit 126, as well as a voltage source V7 that turns on and turns off the transistor Q4. The voltage source V7, in conjunction with the resistor R4, is also understood to set the bias point of the transistor Q4. In this regard, the voltage source V7 corresponds to the control line EDGE_ON 102. A capacitor C13 is related to the capacitor C9, which likewise stabilizes and controls gain shape over a desired frequency range. A bias voltage source V8 is applied to the collector 126*c*, and there is an RF-decoupling capacitor C14 that is connected to the collector 126*c* of the transistor Q14 as well. The voltage source V8, like the voltage sources V3 and V5, corresponds to the VCC 106 described above.

The switching circuit 88 also has the third amplifier segment 112 including the transistor Q5, which represents a dedicated power amplifier stage for the CDMA signals. The transistor Q5 is in a common-emitter configuration, with a collector 128*b* connected to an output matching circuit 130 with an inductor L9 and a capacitor C18. The output matching circuit 130 matches the impedance at the output CDMA/EDGE_RF_OUT 96 to a subsequent power amplifier stage, which typically has an impedance of 50 ohms, and generally corresponds to the matching circuit Z3 described briefly above. The third amplifier segment 112 also includes an input matching circuit 132 with capacitors C16 and C17 and inductors L7 and L8. The input matching circuit 132 is understood to match the impedance at the input CDMA_RF_IN 92 with the transceiver 24. A voltage source V6 connected to a base 128*a* through the inductor L8 turns on and turns off the transistor Q5, and in conjunction with the resistor R5, sets the bias point for the transistor Q5. Thus, the voltage source V6 corresponds to the control line CDMA_ON 104.

It will be appreciated by those having ordinary skill in the art that the foregoing detailed description of the switch circuit 88 has been presented by way of example only and not of limitation. There are several variations involving components that may be substituted; for example, although only a single transistor has been shown for the various amplifier circuits, there may be multiple transistor stages if higher gain is required. Along these lines, while the above description referenced voltage sources with series resistors as the control inputs, it is understood that other configurations such as current minors and the like may be substituted. Similarly, specific input, output, and inter-stage impedance matching circuits have been presented, but again, different configurations may also be utilized.

While the various transistors are illustrated as being of the bipolar junction type (BJT), other transistor structures may be substituted, such as hetero-junction bipolar types (HBT), field effect types including metal semiconductor field effect (MESFET), metal-oxide semiconductor field effect (MOSFET), and high electron mobility (HEMT). When employing field effect transistors, those having ordinary skill in the art will recognize that any reference to the term base in the above description is intended to also refer to a gate, that any reference to the term emitter also refers to a source, and that any reference to the term collector also refers to a drain. The forgoing listing of semiconductor structures is not intended to be limiting, and any other suitable structure may be utilized.

It is envisioned that the switch circuit 88 be fabricated on a semiconductor die with either a silicon or gallium arsenide (GaAs) substrate. The switch circuit 88 is understood to operate in small-signal conditions, so the physical size may be reduced with accompanying price reductions. Some embodiments of the switch circuit 88 contemplate a single, standalone die, though the switch circuit may also be incorporated into the dies of other devices including the transceiver, the power amplifier, and so forth. Such embodiments may significantly reduce average power consumption. Even discrete components may be used, though the associated footprint may be too large for practical applications.

As indicated above, the switch circuit 88 according to various embodiments differs from conventional double pole, double throw switches in that the input signal is amplified, rather than attenuated due to insertion losses. Accordingly, the design and configuration of associated power amplifiers may be greatly simplified, and may allow the transceiver 24 to deliver less power to the front end circuit 30.

Referring back to the schematic diagram of the front end circuit 30 of FIG. 2, one embodiment of the present disclosure contemplates that the first switch 68, the second switch 70, and the CDMA/EDGE power amplifiers 60 are fabricated as a single module 134. In some cases, each component may be fabricated as a standalone integrated circuit, but packaged into the module 134. This fabrication method refers to System in Package, or SIP. In other cases, all of the components may be fabricated on a single die, which is referred to in the art as System on Chip, or SoC. Regardless of the packaging modality, it us understood that the module 134 has various pins that interface to the other components within the front end circuit 30 as well as to the ports of the front end circuit 30 interfacing with the transceiver 24. In this regard, the module 134 includes a first input pin 136 that connects the GSM/EDGE high band port 44 to the first port 72 of the first switch 68, and a second input pin 138 that connects the CDMA high band port 50 to the second port 74 of the first switch 68. The module 134 further includes a third input pin 140 that connects the GSM/EDGE low band port 46 to the first port 80 of the second switch 70, and a fourth input pin 142 that connects the CDMA low band port 50 to the second port 82 of the second switch 70. Additionally, since the DC-DC circuit 66 is understood to be external to the module 134, an input pin 144 is provided therefor. The input pin 144 is then tied to the power inputs for each of the CDMA/EDGE power amplifiers 60.

Because the GSM power amplifiers are also external to the module 34, there is a first output pin 146 connecting the third port 76 of the first switch 68 and the first GSM power amplifier 56, and a second output pin 148 connecting the fourth port 78 of the first switch 68 and the second GSM power amplifier 58. In light of the aforementioned configuration of the first switch 68 and the second switch 70, the present disclosure contemplates the GSM signals being passed to the GSM power amplifiers 54. Thus, the GSM power amplifiers 54 can be tuned without sacrificing performance that would otherwise be required for handling EDGE communications as well.

In the embodiment illustrated in FIG. 2, the CDMA/EDGE power amplifiers 60 are part of the module 134, so the switches 68, 70 are internally connected thereto. The CDMA/EDGE power amplifiers 60 are tuned to meet both the CDMA and EDGE signal requirements, that is, the power level at the antenna 36 can be approximately 24 dBm in CDMA mode, approximately 27 dBm+/−3 dB in low band EDGE mode, and 26 dBm+3 dB/−4 dB in high band EDGE mode. Thus, it is understood that the CDMA/EDGE power amplifiers 60 may have a slightly lower efficiency in CDMA mode in comparison to the EDGE mode at maximum power levels.

The output of the CDMA/EDGE power amplifiers 60 are intended to be connected to other components, in particular, to CDMA/EDGE isolators 154, 156. Accordingly, the module 134 includes a third output pin 150 and a fourth output pin 152 that are connected to the first CDMA/EDGE power amplifier 62 and the second CDMA/EDGE power amplifier 64, respectively. The CDMA/EDGE isolators 154, 156 are envisioned to maintain EDGE signal quality, and with further tuning, output power can be tuned for higher efficiency. There is an associated signal attenuation of around 0.7 dB to 1 dB, however.

Thus far, only the transmit-related features of the front end module 30 have been considered. As part of the circuitry between the antenna 36 and the transceiver 24, the front end module 30 may also receive RF signal transmissions of various modes, including CDMA, EDGE, and GSM. In this regard, the front end module 30 includes a first set of receive ports 158 that passes through or relays GSM and EDGE signals received by the antenna 36. The first set of receive ports 158 may also be referred to as the GSM/EDGE receive ports, for the communications mode of which signals it carries. With reference again to the block diagram of FIG. 1, the first set of receive ports may be connected to the receive line 33. The constituent ports of the GSM/EDGE receive ports 158 may include a first high band port 160, a second high band port 162, and a low band port 164. These ports are understood to carry signals in the PCS1900 frequency band, the DCS 1800 frequency band, the GSM800/GSM900 frequency band, respectively.

The front end module also includes a second set of receive ports 166 that passes through or relays CDMA signals received by the antenna 36. The second set of receive ports 166 may thus also be referred to as the CDMA receive ports. As shown in FIG. 1, the second set of receive ports may be connected to the receive line 35. CDMA signals may also have a high band and a low band, so accordingly, the front end module 30 has a high band port 168 and a low band port 170 therefor. As indicated above, transmit and receive operations can occur simultaneously in the CDMA operating mode. Therefore, the CDMA/EDGE power amplifiers 60 are to be connected to the antenna 36 whenever the CDMA receive ports 166 are connected to the antenna 36, and vice versa. The CDMA/EDGE power amplifier 62, which is selectively connectible to the CDMA high band port 50, and the high band CDMA receive port 168 are connected to a first diplexer 172. Furthermore, the CDMA/EDGE power amplifier 64, which is selectively connectible to the CDMA low band port 52, and the low band CDMA receive port 52 are connected to a second diplexer 172. It is understood that the diplexers 172, 174 allows frequency domain multiplexing, with a high pass filter of one input port and a low pass filter of the other input port being combined to an output port. When transmitting or receiving a CDMA signal through the diplexers 172, 174, there is approximately a 1.7 dB to 2 dB signal attenuation.

With the various transmit and receive lines for the different operating modes, there is contemplated a multi-position switch 176 that selectively connects each to the antenna 36. In accordance with one embodiment, the multi-position switch 176 has a single pole 178 and seven throws 180*a-g*. The pole 178 is connected to an antenna output port 182 of the front end module 30, which, in turn, is connected to the antenna 36. The first throw 180*a* is connected to the first GSM power amplifier 56, and the second throw 180*b* is connected to the second GSM power amplifier 58. The third throw 180*c* is connected to the first GSM/EDGE high band port 160, the fourth throw 180*d* is connected to the second GSM/EDGE high band port 162, and the fifth throw 180*e* is connected to the GSM/EDGE low band port. The sixth throw 180*f* is connected to the output of the first diplexer 172, and the seventh throw 180*g* is connected to the output of the second diplexer 174. As noted above, one embodiment of the multi-switch 176 utilizes a single pole, and accordingly, any one of the throws 180*a-g* can be connected thereto in a single instance. Depending on the configuration specifics, there may be an approximate 1 dB attenuation in any signals passing through the multi-position switch 176.

Figure 5:
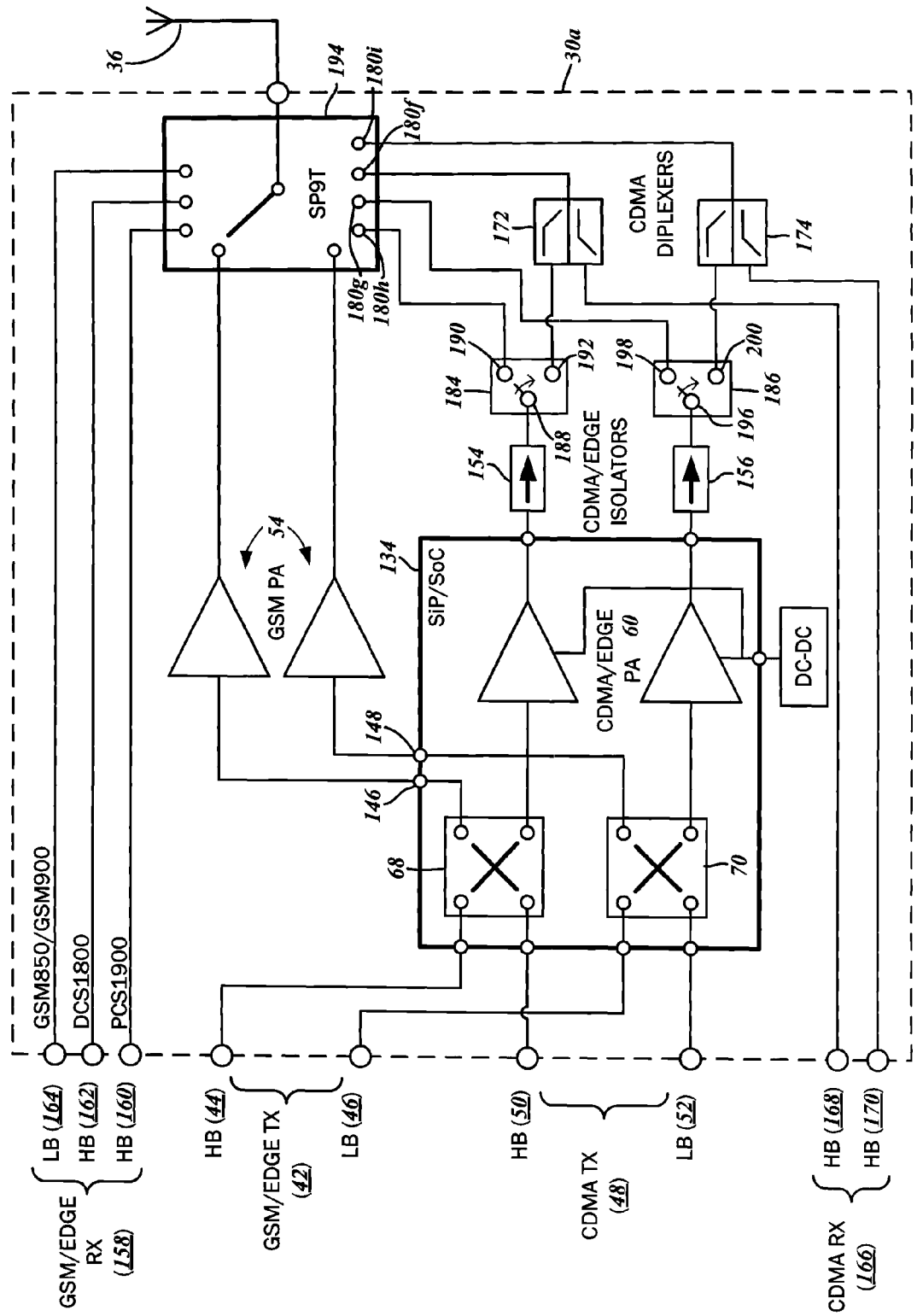
FIG. 5 is a circuit schematic diagram of a first variant of the front end circuit in accordance with the one embodiment of the present disclosure.

With reference to the schematic diagram of FIG. 5, there is depicted a first variant of the front end circuit 30*a*. In almost all respects, the first variant 30*a* is identical to the above-described front end circuit 30, including the module 134 with the first switch 68 and the second switch 70, and the integrated CDMA/EDGE power amplifiers 60. Similarly, the GSM power amplifiers 54 are configured identically, and connected to the same first output pin 146 and second output pin 148. The third output pin 150 and the fourth output pin 152 are connected to the first CDMA/EDGE isolator 154 and the second CDMA/EDGE isolator 156, respectively.

However, the output from the first CDMA/EDGE isolator 154 is connected to a first diplexer switch 184 and the output from the second CDMA/EDGE isolator 156 is connected to a second diplexer switch 186. It is understood that the first and second diplexer switches 184, 186 are identical, so the details pertaining to one will be equally applicable to the other. The first diplexer switch 184 may be a single pole, double throw switch in which the pole 188 is connected to the first CDMA/EDGE isolator 154. A first throw 190 is connected directly to a different multi-position switch 194 different in some respects to the multi-position switch 176 discussed above. A second throw 192 is connected to the first CDMA diplexer 172, which, in turn, is connected to the multi-position switch 194. Similarly, a first pole 196 is connected to the second CDMA/EDGE isolator 156, a first throw 198 is connected directly to the multi-position switch 194, and a second throw 200 is connected to the second CDMA diplexer 174 that is connected to the multi-position switch 194. To accommodate the additional transmission lines, the multi-position switch 194 has an additional eighth pole 180*h* connected to the first diplexer switch 184 and an addition ninth pole 180*i* connected to the second diplexer switch 186.

This configuration is contemplated to increase the efficiency of the EDGE transmit chain, as losses associated with the CDMA diplexers 172, 174 would be eliminated. Instead, as indicated above, during EDGE transmit, the signal is directly passed to the multi-position switch 194. This yields approximately a 1.2 dB to 1.7 dB improvement in loss between the CDMA/EDGE power amplifiers 60 and the antenna 36. However, because of the additional switch circuits, control lines and RF signal lines necessary, this variant may not be as cost effective. The output of the CDMA/EDGE power amplifiers 60 is decoupled from the antenna voltage standing wave (VSWR) variation because of the CDMA/EDGE isolators 154, 156 similar to the embodiment of the front end circuit 30 discussed above. It is understood that because the diplexer switches 184, 186 are operating under large signal conditions, a conventional MESFET or HEMT GaAs process may be utilized for fabrication.

Figure 6:
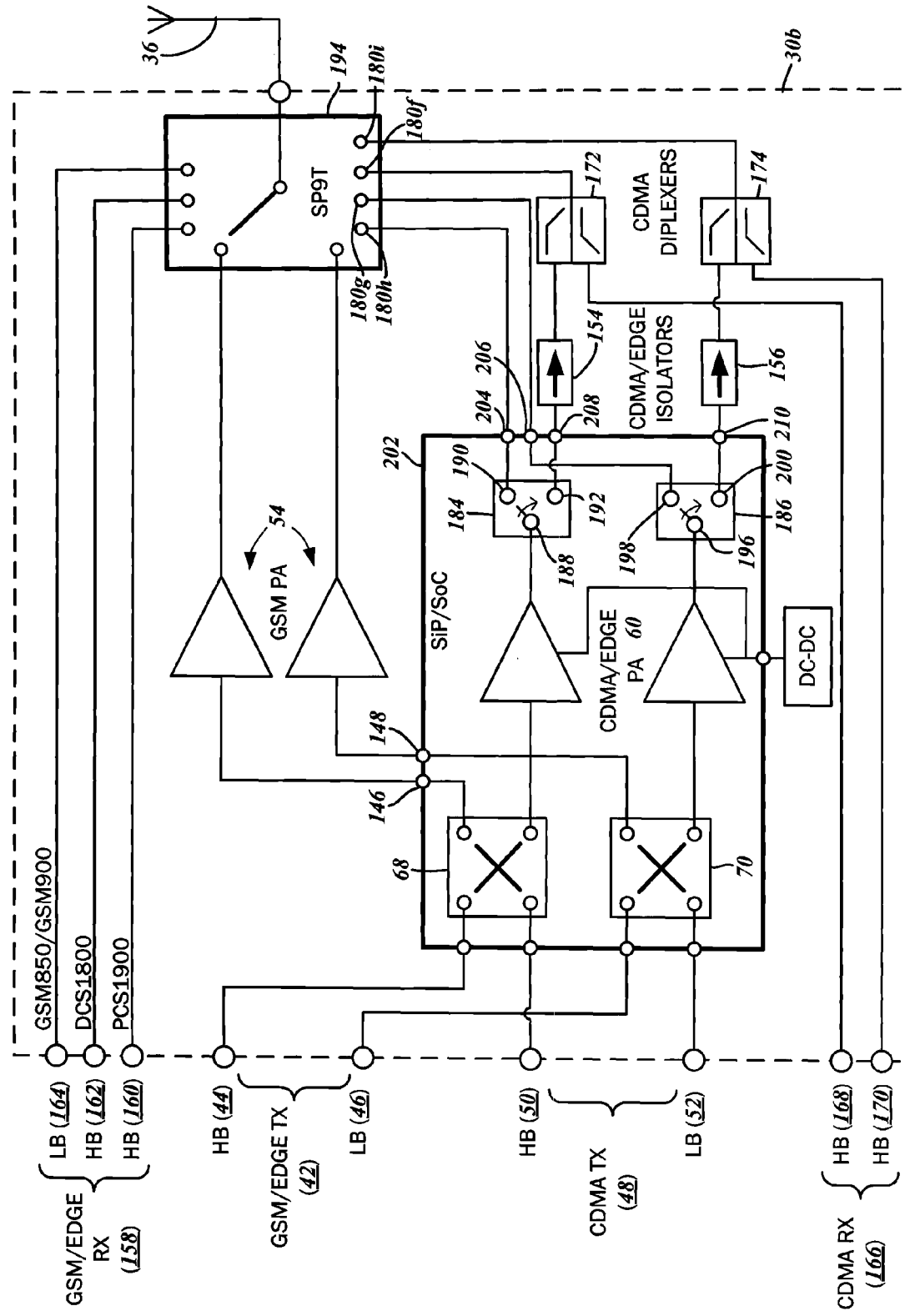
FIG. 6 is a circuit schematic diagram of a second variant of the front end circuit.

The schematic diagram of FIG. 6 illustrates a further second variant 30*b* over the front end circuit 30*a* discussed above with reference to FIG. 6. As noted above, the first variant 30*a* utilizes a pair of diplexer switches 184, 186 to separate the EDGE signals from the CDMA diplexers 172, 174, but was fabricated off-board the module 134. In the second variant 30*b*, an alternative module 202 is contemplated that includes first and second switches 68, 70, the CDMA/EDGE power amplifiers 60, and the first and second diplexer switches 184, 186. Thus, instead of the first and second diplexer switches 184, 186 being separate, they are integrated into the module 202. The CDMA/EDGE isolators 154, 156 remain external to the module 202. Because there are now two outputs each from the CDMA/EDGE power amplifiers 60, the module 202 includes four, instead of two, output pins. Specifically, there is a third output pin 204 tied to the first throw 190 of the first diplexer switch 184, a fourth output pin 206 tied to the first throw 198 of the second diplexer switch 186, a fifth output pin 208 tied to the second throw 192 of the first diplexer switch 184, and a sixth output pin 210 tied to the second throw 200 of the second diplexer switch 186. All other parts of the module 202 are identical, however, including the various input pins 136, 138, 140, and 142, and the output pins 146, 148. Furthermore, the same multi-position switch 194 is utilized. The third output pin 204 is connected to the eighth pole 180*h*, and the fourth output pin 206 is connected to the ninth pole 180*i*.

As indicated above, the use of the diplexer switches 184, 186 is contemplated to increase EDGE mode efficiency by eliminating attenuation from the CDMA diplexers 172, 174. Again, there is approximately 0.7 dB to 1 dB improvement in loss between the CDMA/EDGE power amplifiers 60 to the antenna 36. By incorporating the diplexer switches 184, 186 into the single module 202, a smaller package size may result, and thereby being more cost-effective. Since the diplexer switches 184, 186 are operating at higher power, they may be fabricated on a GaAs substrate.

Figure 7:
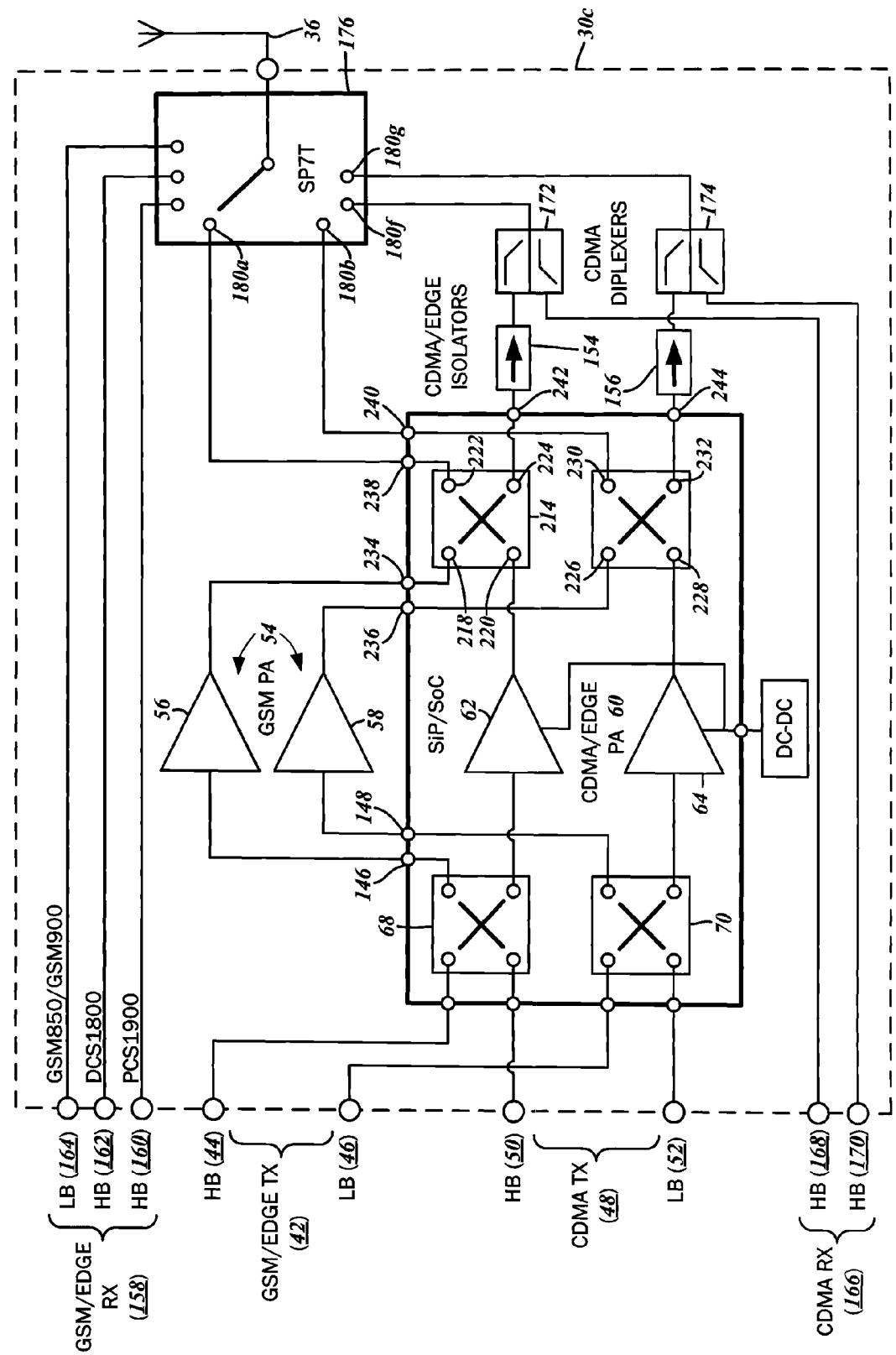
FIG. 7 is a circuit schematic diagram of a third variant of the front end circuit.

FIG. 7 illustrates a further third variant 30*c* of the front end module 30 discussed above with reference to FIG. 2. The third variant 30*c* utilizes an alternative module 212 that not only includes the first switch 68, the second switch 70, the first CDMA/EDGE power amplifier 62, and the second CDMA/EDGE power amplifier 64, but also a third switch 214 and a fourth switch 216, which may also be referred to as output switches. Because the third switch 214 and the fourth switch 216 operate with large signals, they may be configured differently from the first switch 68 and the second switch 70 described above. However, as depicted in FIG. 7, the third switch 214 and the fourth switch 216 are understood to be a double pole/double throw type. The third switch 214 has a first port (input) 218, a second port (input) 220, a third port (output) 222, and a fourth port (output) 224. Similarly, the fourth switch 216 has a first port (input) 226, a second port (input) 228, a third port (output) 230, and a fourth port (output) 232.

Instead of connecting the GSM power amplifiers 54 directly to the multi-position switch 176, they are connected back to the module 212 via secondary input pins 234, 236. More particularly, the first GSM power amplifier 56 is connected to the first secondary input pin 234, while the second GSM power amplifier 58 is connected to the second secondary input pin 236. The first secondary input pin 234 is tied to the first port 218 of the third switch 214, and the second secondary input pin 236 is tied to the first port 226 of the fourth switch 216. The first CDMA/EDGE power amplifier 62 is tied to the second port 220 of the third switch 214, and the second CDMA/EDGE power amplifier 64 is tied to the second port 228 of the fourth switch 216. The third outputs 222, 230 of the third and fourth switches 214, 216, are tied to a respective one of a third output pin 238 and a fourth output pin 240 of the module 212. The fourth outputs 224, 232 of the third and fourth switches 214, 216, are tied to a respective one of a fifth output pin 242 and a sixth output in 244. The third output pin 238 is connected to the first throw 180*a*, and the fourth output pin 240 is connected to the second throw 180*b*. The fifth output pin 242 is connected to the first CDMA/EDGE isolator 154, and the sixth output pin 244 is connected to the second CDMA/EDGE isolator 156. These components and the CDMA diplexers 172, 174 are configured and laid out identically as the front end circuit 30 discussed above.

Based on the above configuration of the module 212, it is contemplated that in actual operation, when the GSM power amplifiers 54 are active, then the signals are passed directly to the multi-position switch 176. As indicated above, when the CDMA/EDGE power amplifiers 56 are active, the signal may be either CDMA or EDGE. If the signal is CDMA, then the third and fourth switches 214, 216 interconnect the CDMA/EDGE power amplifiers 56 to the fifth and sixth output pins 242, 244, respectively, and to the CDMA transmit chain, that is, the CDMA isolators 154, 156 and the CDMA diplexers 172, 174. If the signal is EDGE, then the third and fourth switches 214, 216 interconnect the CDMA/EDGE power amplifiers 56 to the third and fourth output pins 238, 240, respectively. Accordingly, the CDMA chain is bypassed when an EDGE signal is transmitted through the module 212.

This embodiment of the module 212 is intended for applications that do not involve modifying existing architectures of the front end module 30. As set forth above, the first switch 68, the second switch 70, the third switch 214, and the fourth switch 216, along with the CDMA/EDGE power amplifiers 60, are incorporated into a single package, either as a SoC or SiP. This is envisioned to be more cost effective, and smaller device sizes can be achieved. Although the first and second switches 68, 70 operate under small-signal conditions, the third and fourth switches 214, 216 operate under large-signal conditions. Thus, these switches may be fabricated with a GaAs substrate. Without the GSM power amplifiers 54 being directly connected to the multi-position switch 176 unlike the other previously described variants, there is an expected signal attenuation of approximately 0.5 dB to 0.7 dB associated with the third and fourth switches 214, 216. In this case, it is contemplated that the GSM power amplifiers 54 are tuned for higher power levels, considering that no trade-offs in EDGE mode operations is necessary.

Figure 8:
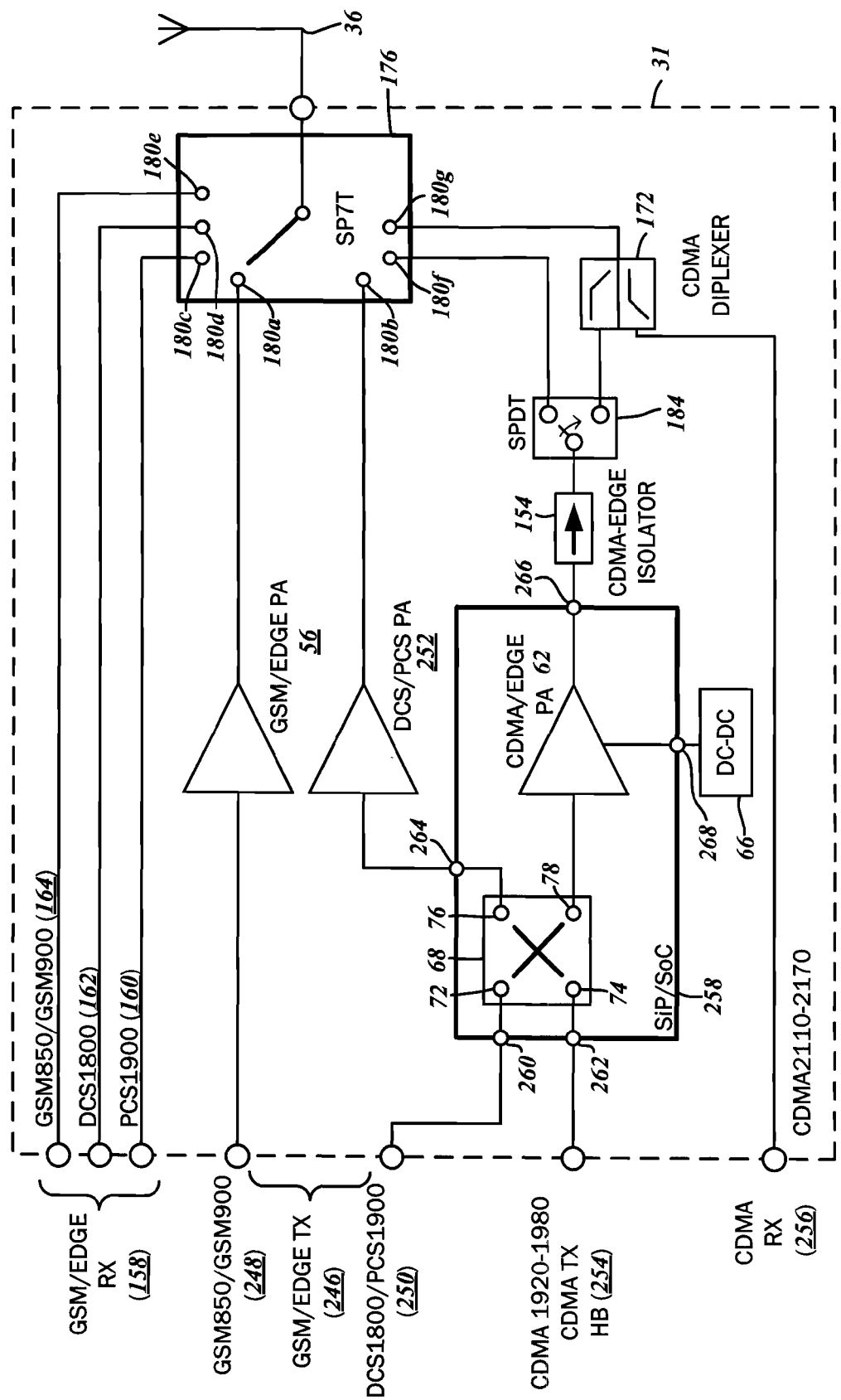
FIG. 8 is a circuit schematic diagram of another embodiment of the front end circuit.

FIG. 8 illustrates another embodiment of the front end circuit 31, which differs in several regards from the front end circuit 30 discussed above. Primarily, the front end circuit 31 is adapted for a single frequency band CDMA multi-mode platform that utilizes the 1920 MHz to 1980 MHz band for transmit, and the 2110 MHz to 2170 MHz band for receive. This configuration is typical for first generation multimode platforms that use both GSM/EDGE and CDMA. In further detail, the front end circuit 31 has a set of GSM-EDGE inputs ports 246 or first inputs, which includes a GSM850/GSM900 port 248 and a DCS1800/PCS1900 port 250. The GSM850/GSM900 port 248 is understood to be identical (with respect to the signal received from the transceiver 24) to the GSM/EDGE low band port 46 of the front end circuit 30 discussed above. The first GSM/EDGE power amplifier 56, which is dedicated to GSM850/GSM900 signals, is directly connected to the GSM850/GSM900 port 248, and to the multi-position switch 176. It is understood that on the DCS1800/PCS1900 port 250, either GSM signals or EDGE signals may be received. For GSM signals, there is a dedicated DCS1800/PCS1900 amplifier 252. As described above, the present disclosure contemplates utilizing the first CDMA/EDGE power amplifier 62 for the EDGE signals received on the DCS1800PCS1900 port 250, as well as for the CDMA 1920-1980 signals received on single CDMA transmit port 254.

Based upon the switching state of the first switch 68, different connections can be made. The control signals utilized to set the first switch 68 in the following ways are identical to those discussed above. When the GSM850/GSM900 signal is received on the port 248, it is amplified by the GSM/EDGE power amplifier 56 and passed to the first throw 180a of the multi-position switch 176. When a GSM signal is received on the DCS1800/PCS1900 port 250, the first switch 68 is set such that the first port 72 is connected to the third port 76, hence the DCS/PCS power amplifier 252. When an EDGE signal is received on the DCS1800/PCS1900 port 250, the first switch 68 is set such that the first port 72 is connected to the fourth port 78, thereby passing the signal to the first CDMA/EDGE power amplifier 62 and to the second throw 180b. When a CDMA signal is received on the CDMA transmit port, the first switch 68 is set such that the second port 74 is connected to the fourth port 78. The signal is likewise passed to the first CDMA-EDGE power amplifier 62. When a signal (either CDMA or EDGE) is amplified by the first CDMA-EDGE power amplifier 62, it is output to the first CDMA-EDGE isolator 154. The power output characteristics of the first CDMA-EDGE power amplifier 62 are chosen to meet both the CDMA and EDGE specifications, which is typically 24 dBm at the antenna 36 for CDMA, 27 dBm+/−3 dB for low band EDGE, and 26 dBm+3 dB/−4 dB for high band EDGE. Thus, as mentioned previously, the first CDMA-EDGE amplifier 62 may be slightly less efficient in the CDMA mode than the EDGE mode. Along these lines, further improvements in efficiency may be realized by employing the DC-DC converter 66 to bias and power the first CDMA-EDGE amplifier 62.

The first CDMA-EDGE isolator 154 is understood to maintain a quality EDGE signal. With a CDMA signal, the first diplexer switch 184 selectively connects the first CDMA-EDGE isolator 154 to the first CDMA diplexer 172 and the seventh throw 180g in the manner discussed above. With an EDGE signal, the first diplexer switch 184 bypasses the first CDMA diplexer 172 and connects directly to the sixth throw 180f. It is recognized that based on this configuration, the EDGE mode and the CDMA do not operate simultaneously. However, as discussed before, practical applications do not require this because of time-domain sharing.

The front end circuit 31 is also understood to have the same first set of receive ports 158 including the PCS1900/first high band receive port 160, the DCS/second high band receive port 162, and the GSM850/GSM900/low band receive port 164. However, because only a single CDMA band is used in the transmit chain, there is likewise only a single CDMA band used in the receive chain. Thus, the front end circuit 31 includes a CDMA receive port 256 that is directly connected to the CDMA diplexer 172.

In accordance with one embodiment, the first switch 68 and the first CDMA-EDGE amplifier 62 are fabricated as a single package or module 258. In order to interface with the other components of the front end circuit 31, there are various input pins and output pins. There is a first input pin 260 for interfacing the DCS1800/PCS1900 port 250 to the first port 72 of the first switch 68, and a second input pin 262 for interfacing the CDMA transmit port 254 to the second port 74 of the first switch 68. There is also a first output pin 264 for interfacing the third port 76 of the first switch 68 to the DCS/PCS power amplifier 252, and a second output pin 266 for external interfacing the CDMA/EDGE power amplifier 62. A third input pin 268 may be utilized to connect the DC-DC converter 66.

Figure 9:
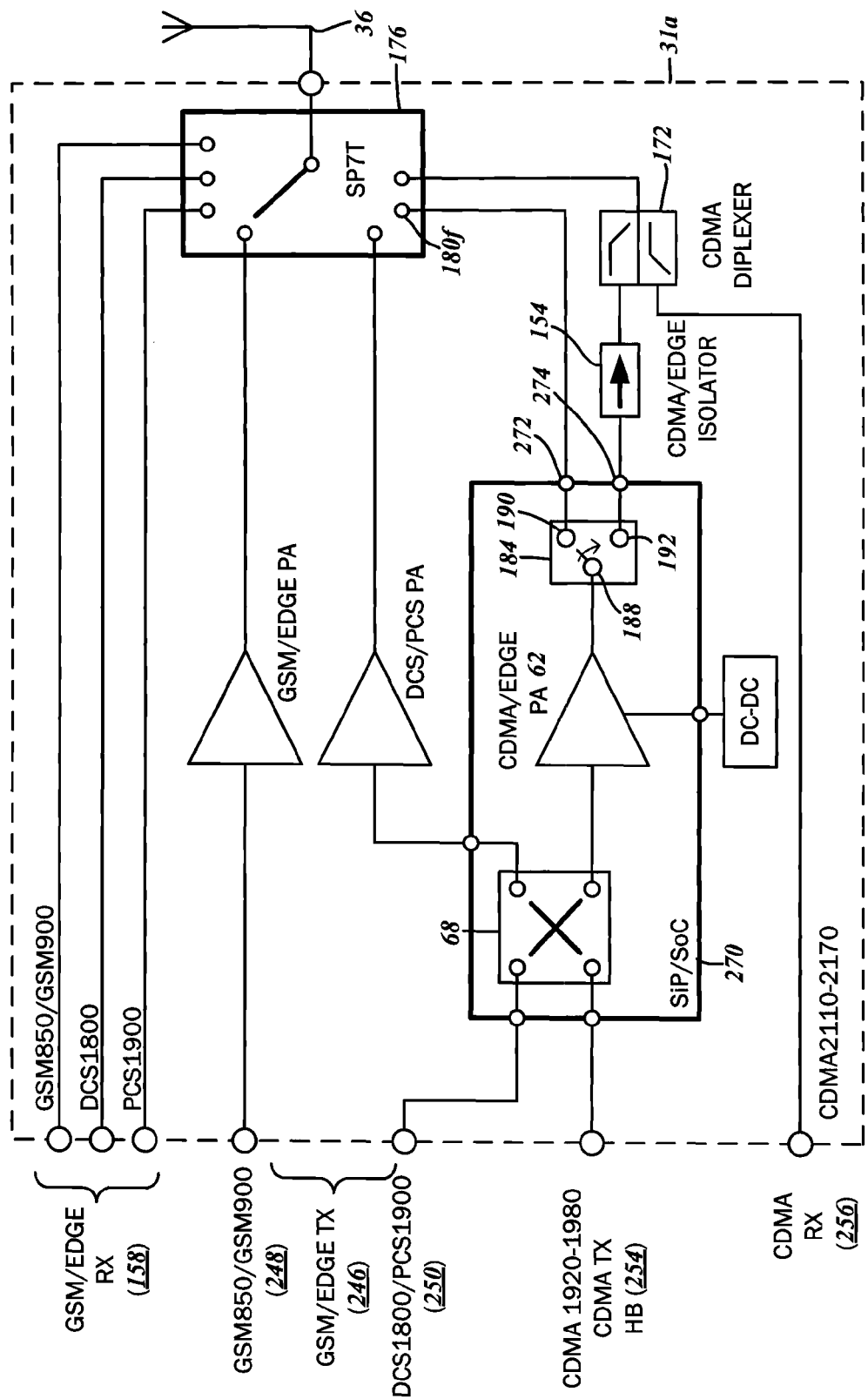
FIG. 9 is a circuit schematic diagram of a first variant of the other embodiment of the front end circuit.

A first variant of a front end circuit 31a is shown in the schematic diagram of FIG. 9. While most of the components and configuration are identical to the front end circuit 31, the first diplexer switch 184 is incorporated into a single module 270 along with the first switch 68 and the first CDMA-EDGE power amplifier 62. In this regard, the first pole 188 of the first diplexer switch 184 is connected to the output of the CDMA-EDGE power amplifier 62. Additionally, the module 270 includes a different second output pin 272 and a third output pin 274. The second output pin 272 is connected to the first throw 190 and directly connects the output of the CDMA- EDGE power amplifier 62 to the sixth throw 180f of the multi-position switch 176, thereby bypassing the CDMA chain (and avoiding associated signal losses). The third output pin 274 is connected to the first CDMA-EDGE isolator 154, which in turn is connected to the first CDMA diplexer 172. All other input and output pins of the module 270, as well as the functions of the components of front end module 31b, are understood to be identical to those discussed above.

Figure 10:
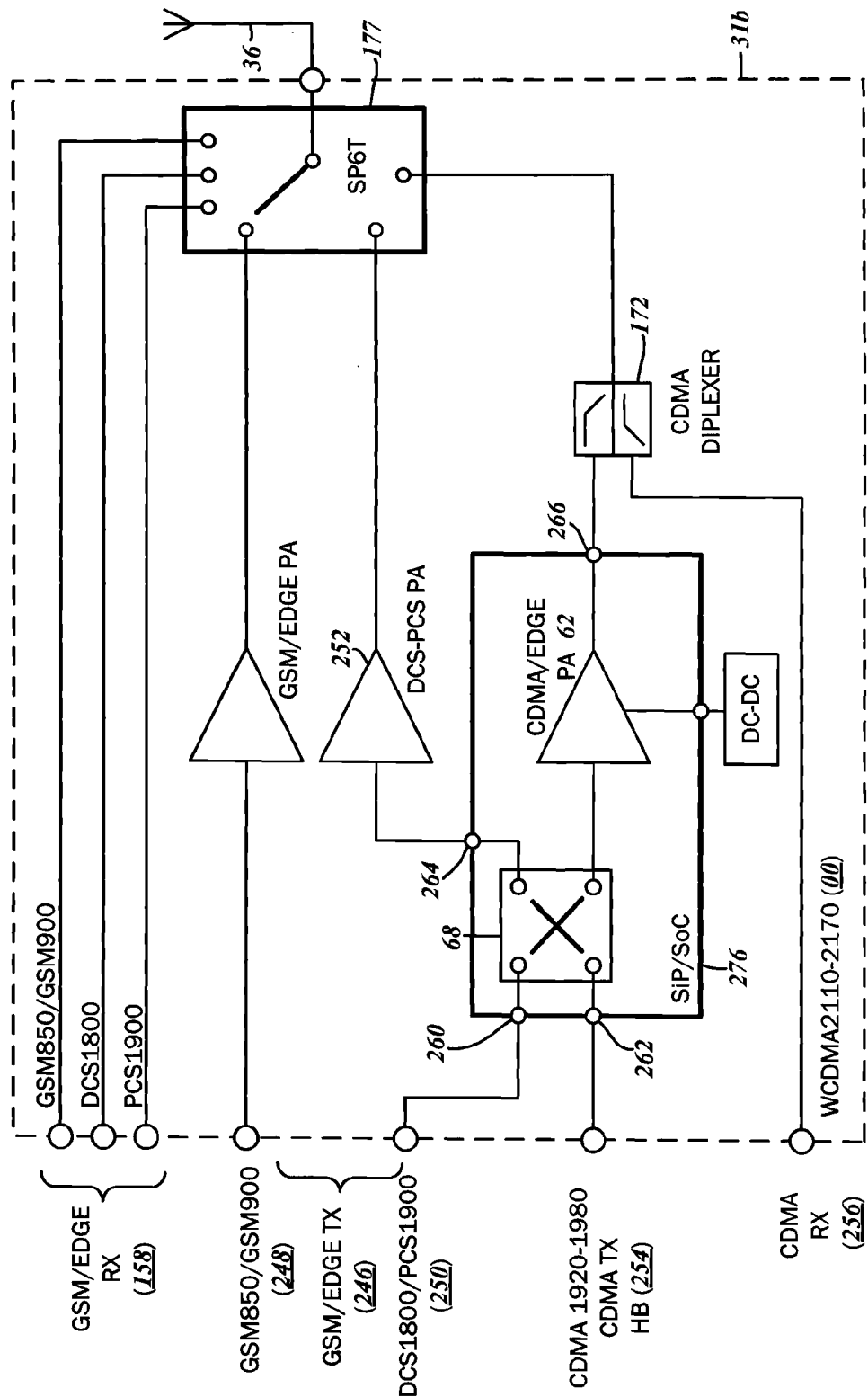
FIG. 10 is a circuit schematic diagram of a second variant of the other embodiment of the front end circuit.

FIG. 10 shows a second variant of a front end circuit 31b. Again, like the first variant 31a, the second variant 31b is substantially identical to the front end circuit 31. In the second variant 31b, the first diplex switch 184 has been removed, and the CDMA-EDGE power amplifier 62 is simply connected to the first CDMA diplexer 172, which is then connected to a multi-position switch 177. The multi-position switch 177 is understood to be substantially the same as the multi-position switch 176 mentioned above in relation to the other variants, but with one less throw 180. The circuit including the first switch 68 and the CDMA-EDGE power amplifier 62 can be packaged into a single module 276 having the first and second input pins 262, the first output pin 264 connectible to the DCS/PCS power amplifier 252, and a second output pin 266. For using the CDMA diplexer 172 in this configuration, it is understood that all frequency bands for the transmission modes noted above can be covered thereby. With the omission of the first CDMA-EDGE isolator 154 and first diplexer switch 184, it is envisioned that signal loss can be improved. However, it is also understood that tolerance to antenna VSWR variations decreases, though can be counteracted to some degree by properly selecting the back-off of the CDMA-EDGE power amplifier 62.

Figure 11:
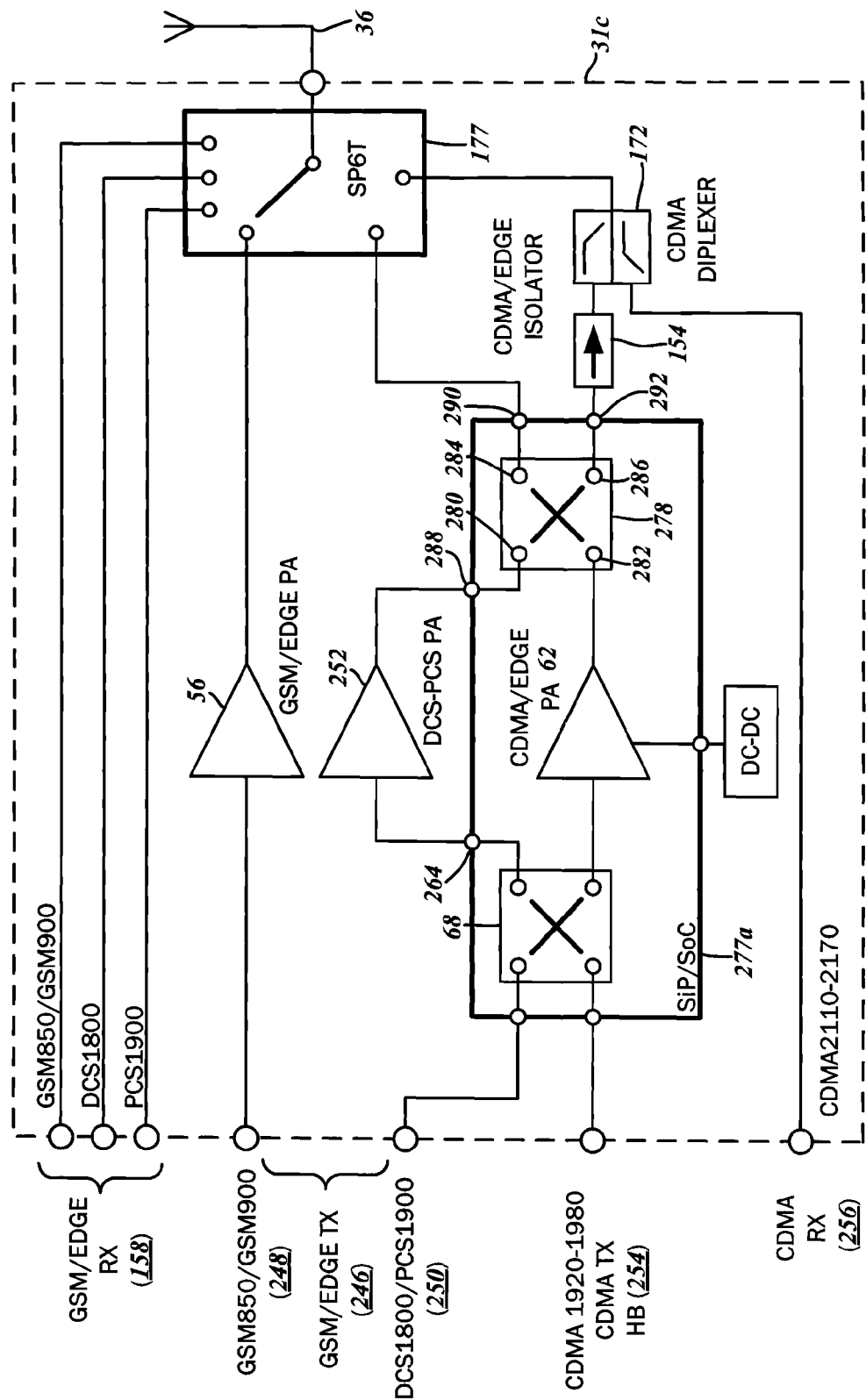
FIG. 11 is a circuit schematic diagram of a third variant of the other embodiment of the front end circuit.
Figure 12:
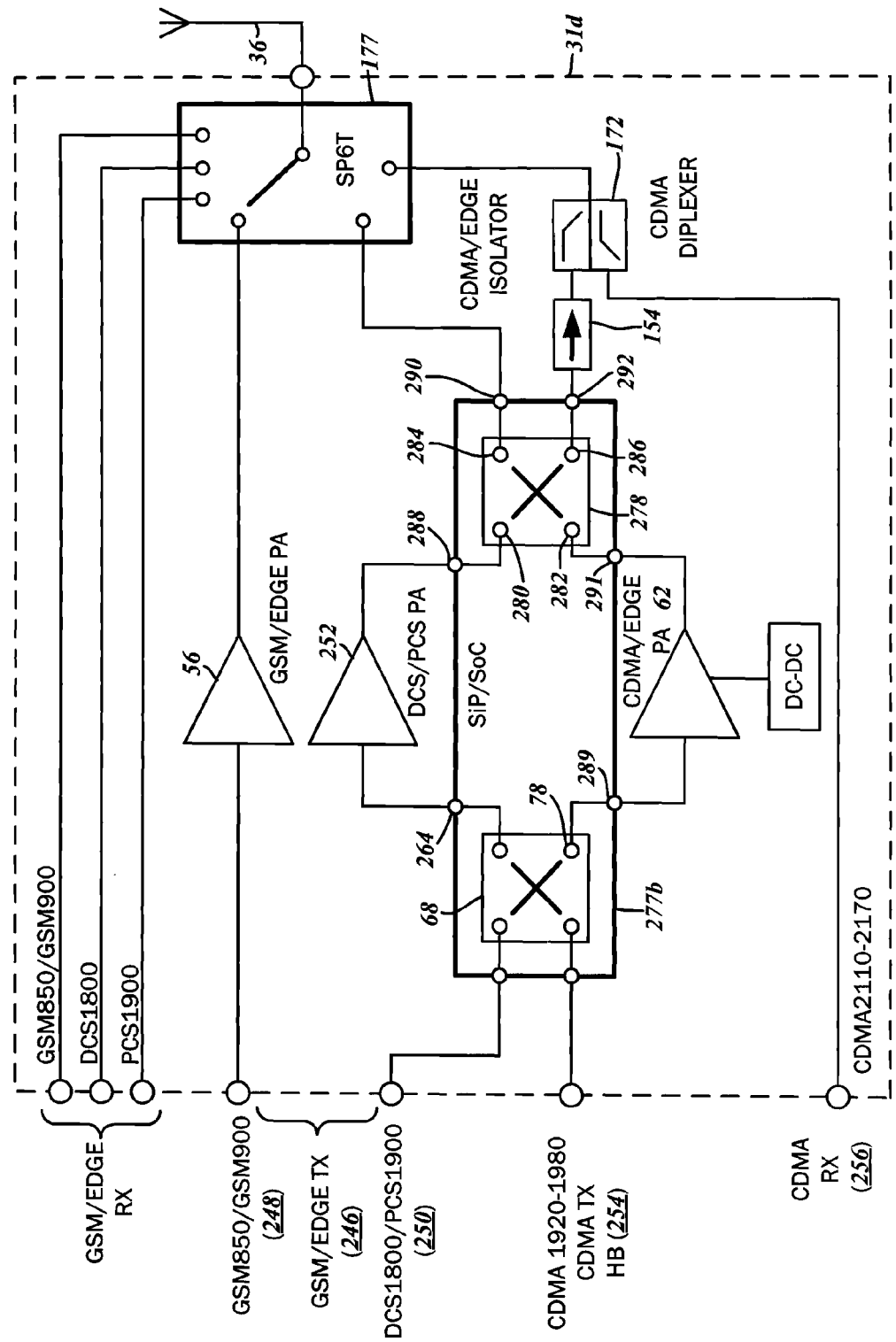
FIG. 12 is a circuit schematic diagram of a fourth variant of the front end circuit.

With reference to FIGS. 11 and 12, a related third variant 31c and a fourth variant 31d, respectively, of the front end circuit 31 are contemplated. Some of the primary components of both the third variant 31c and the fourth variant 31d are identical, so the two will be discussed together. The differences, to the extent there are any, will be explained in further detail below. Both the third variant 31c and the fourth variant 31d have a second switch 278 in addition to the first switch 68 that are included in respective modules 277a, 277b. The second switch 278 is understood to be identical in all respects to the first switch 68 and may be embodied as the switch circuit 88. The second switch 278 has a first port (input) 280, a second port (input) 282, a third port (output) 284, and a fourth port (output) 286.

As discussed above, the front end circuit 31 is adapted for a single frequency band CDMA multi-mode platform Like the front end circuit 31, the third variant 31c and the fourth variant 31d have a GSM850/GSM900 port 248 and a DCS1800/PCS1900 port 250, collectively referred to as the GSM/EDGE input ports 246, as well as the CDMA transmit port 254. The first switch 68 is connected to the ports of the front end circuit 31 in the configuration discussed previously. Instead of connecting the DCS-PCS power amplifier 252 directly to the multi-position switch 177, it is connected back to the respective modules 277a, b via a secondary input pin 288. In the third variant 31c, the first GSM/EDGE power amplifier 62 is integrated into the module 277a. Hence, the output of the first GSM/EDGE power amplifier 62 is tied to the second port 282 of the second switch 278. In the fourth variant 31d, the first GSM/EDGE power amplifier 62 is external to the module 277b. The fourth port 78 of the first switch 68 is tied to an alternate output pin 289, and the output of the first GSM/EDGE power amplifier 62 is connected to an alternate input pin 291. This, in turn, is tied to the second port 282 of the second switch 278. In both the third variant 31c and the fourth variant 31d, the third port 284 of the second switch 278 is tied to a second output pin 290, and the fourth port 284 of the second switch 278 is tied to a third output pin 292. The second output pin 290 is directly connected to the multi-position switch 177, while the third output pin 292 is connected to the CDMA/EDGE isolator 154. This component and the CDMA diplexer 172 is configured and laid out identically as the front end circuit 31 discussed above.

Based on the above configurations of the modules 277a, b, it is contemplated that in actual operation, when the DCS-PCS power amplifier 56 is active with a GSM signal, then it is passed to the multi-position switch 177 via an interconnection between the first port 280 and the third port 284 of the second switch 278. When the CDMA/EDGE power amplifier 62 is active, the signal is understood to be either CDMA or EDGE. If the signal is EDGE, then the second port 282 and the third port 284 of the second switch 278 are interconnected, passing the signal directly to the multi-position switch 177 via the second output pin 290. Accordingly, the CDMA chain is bypassed when an EDGE signal is transmitted through the modules 277a, b. If the signal is CDMA, then the second port 282 and the fourth port 286 of the second switch 278 are interconnected, passing the signal to the third output pin 292 where it is relayed to the first CDMA/EDGE isolator 154 and the first CDMA diplexer 172.

The third and fourth variants 31c, d with the modules 277a, b are intended for applications that do not involve modifying existing architectures of the front end module 31. As set forth above, the first switch 68, the second switch 278, are incorporated into a single package, either as a SoC or SiP. The third variant 31c further incorporates the CDMA/EDGE power amplifier 62. These configurations are envisioned to be more cost effective, and smaller device sizes can be achieved. Although the first switch 68 operate under small-signal conditions, the second switch 278 operate under large-signal conditions and so may be fabricated with a GaAs substrate. Without the DCS/PCS power amplifiers 252 being directly connected to the multi-position switch 176 unlike the other previously described variants, there is an expected signal attenuation of approximately 0.5 dB to 0.7 dB associated with the second switch 278. In this case, it is contemplated that the DCS/PCS power amplifiers 252 are tuned for higher power levels, considering that no trade-offs in EDGE mode operations is necessary.

Results of simulating the operation of third variant of the front end circuit 31c are presented below. As part of the simulation the front end circuit 31c has been tuned to satisfy EDGE and CDMA linearity requirements at 28 dBm, and the simulation results have shown an efficiency of up to 45% at a 3.6V bias supply.

The power level at the antenna 36, and gain in all chains satisfy performance requirements. For instance, the simulation measured the EDGE1800 and EDGE1900 power at the antenna 36 at 26.3 dBm to 26.5 dBm, where the standard value is 26 dBm+3 dB/−4 dB at maximum linear power. The results of the simulation for WCDMA1900 power at the antenna 36 were calculated to be 23.3 dBm to 24.1 dBm, where the standard value is 24 dBm. The gain in the transmit chain to the antenna 36 for EDGE1800 and EDGE1900 was simulated to be 27.6 dB to 28 dB, which is understood to be sufficient for many mobile applications. Furthermore, the gain in the transmit chain to the antenna 36 for WCDMA1900 was simulated to be 23.6 dB to 24.6 dB, which is above typical requirements. Degradation in gain in the transmit chain for DCS1800 and PCS1900 was simulated to be 1.0 dB to 1.4 dB, and is deemed to be acceptable for many mobile platforms. Along these lines, degradation in power in the transmit chain for DCS1800 and PCS1900 was simulated to be 0.5 to 0.7 dB, in comparison to the standard 30 dBm+/−3 dB. It is understood that the power and gain to the antenna 36 for GSM850 and GSM900 are not impacted.

As indicated above, there is substantial battery power savings associated with the front end circuits 30, 31 of the present disclosure. For example, in EDGE1800 and EDGE1900 operating in single slot mode, the average current draw based on conventional power probability distribution functions (PDF) is approximately 21.8 mA to 24.9 mA. For WCDMA1900-urban, the average current draw is 92.7 mA, and for WCDMA1900-suburban, the average current draw is 113.5 mA. Based upon the configuration of the front end circuits 30, 31, battery consumption has been reduced by over 30% in comparison to conventional front end circuits. With the utilization of the DC-DC converter 66, the EDGE1800 and EDGE1900 current draw has been further reduced to between 15.3 mA and 20.6 mA, WCDMA1900-urban has been further reduced to 46.8 mA, WCDMA1900-suburban has been further reduced to 73.1 mA. The use of the DC-DC converter 66 results in almost twice the reduction in average battery consumption.

Figure 13:
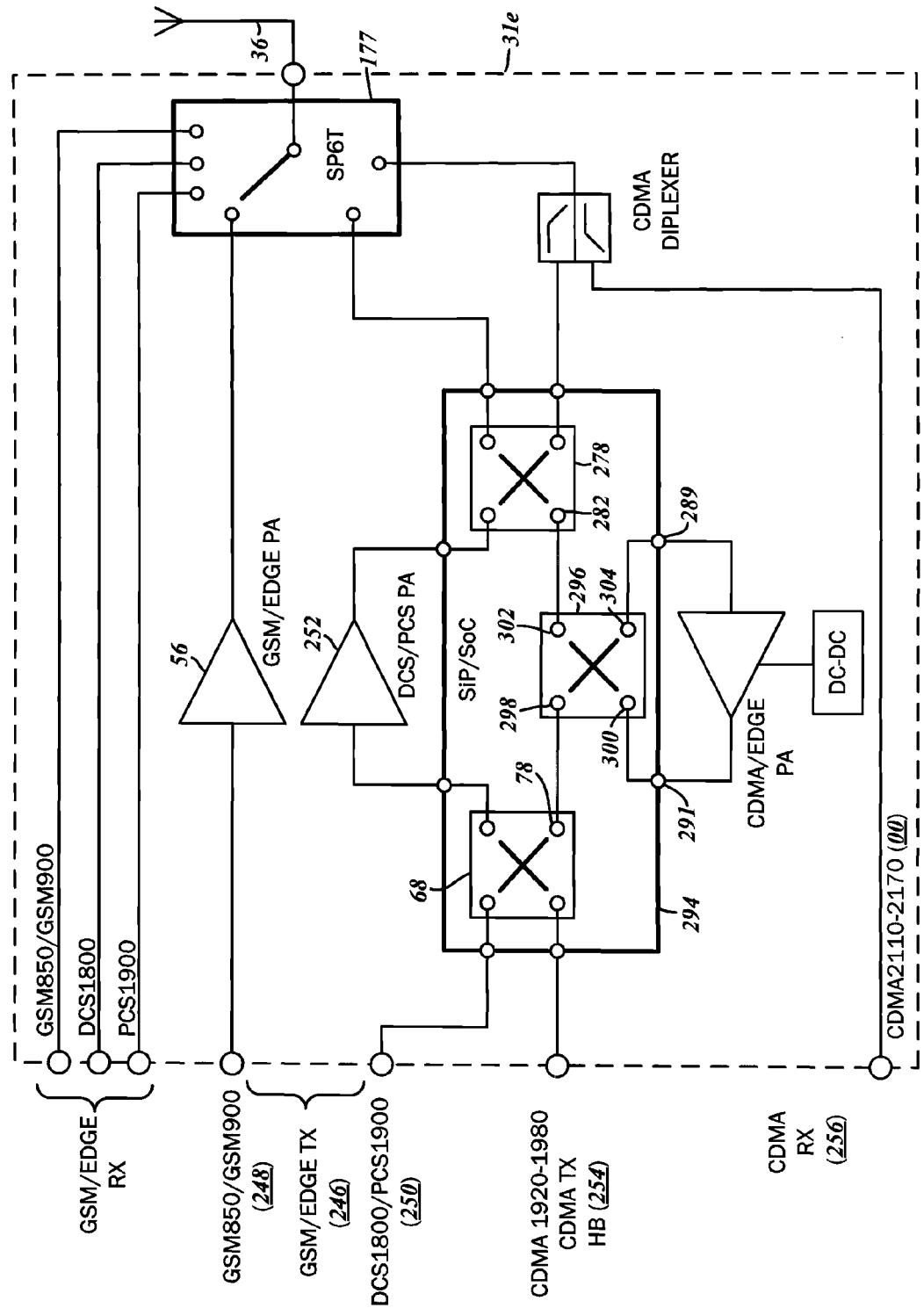
FIG. 13 is a circuit schematic diagram of a fifth variant of the front end circuit.

With reference to the schematic diagram of FIG. 13, there is contemplated a fifth variant of the front end circuit 31e, which is understood to be related to the fourth variant 31d in that the first CDMA/EDGE power amplifier 62 is separate from the first switch 68 and the second switch 278. In addition to the first switch 68 and the second switch 278, however, a module 294 also includes a third switch 296. Because the third switch 296 operates with large signals, they may be configured differently from the first switch 68 and the second switch 278. The third switch 296 has a first port (input) 298, a second port (input) 300, a third port (output) 302, and a fourth port (output) 304. The first port 298 is connected to the fourth port 78 of the first switch 68, and the second port 300 is tied to the alternate input pin 291 that is connected to the output of the first CDMA/EDGE power amplifier 62. The third port 302 is connected to the second port 282 of the second switch 278, and the fourth port 304 is tied to the alternate output pin 289. The input of the first CDMA/EDGE power amplifier 62 is connected to the alternate output pin 289. It is contemplated that the third switch 296 allows the bias voltage for the CDMA/EDGE power amplifier 62 to be turned off at low power levels in the CDMA mode thereby bypassing the same. This could also be done in EDGE mode while handset is in close proximity to a base station. In order to control the third switch 296, additional control signals from the transceiver 24 may be necessary, but baseband control signals may be reused from mode control and enable signals already existing.

This configuration of bypassing the first CDMA/EDGE power amplifier 62 is understood to result in substantial average battery current savings in light of the long-term power probability distribution functions considered above. All other components of the fifth variant 31e are understood to be the same as for the fourth variant 31d unless otherwise noted. Further, although a single CDMA transmit line embodiment has been illustrated, it is expressly contemplated that the variant 31e can be extended to dual channel transceivers/front end circuits without departing from the present disclosure.

In general, various embodiments of the front end circuit 30, 31 are intended to be utilized in handsets 16 in conjunction with existing transceiver architectures. These include, for example, the Qualcomm Platform MSM6275, the Qualcomm single-chip quand-band GPRS-EDGE/Tri-band UMTS/GPS RF transceiver based MSM7200/MSM6245/MSM6255A/ MSM6280, Freescale Fourth Generation WCDMA-EDGE Radio RX300-20, Freescale Quad-Band GSM-GPRS-EDGE-Tri-Band WCDMA Innovative Convergence Platform i.300-30, Freescale Quad-Band GSM-GPRS-EDGE-Tri-Band WCDMA Mobile Extreme Convergence Platform MXC300-30, Single-Chip SMARTi 3GE WCDMA-EDGE RF Transceiver PMB6952, EMP, Nokia, Infineon, Fujitsu, and others.

The particulars shown herein are by way of example only for purposes of illustrative discussion, and are presented in the cause of providing what is believed to be the most useful and readily understood description of the principles and conceptual aspects of the various embodiments set forth in the present disclosure. In this regard, no attempt is made to show any more detail than is necessary for a fundamental understanding of the different features of the various embodiments, the description taken with the drawings making apparent to those skilled in the art how these may be implemented in practice.

What is claimed is:

1. A radio frequency (RF) front end circuit for connecting an antenna to a transceiver having a first operating mode, a second operating mode, and a third operating mode, comprising:
 a first set of transmit ports receptive to signals of the first operating mode and the second operating mode from the transceiver;
 a second set of transmit ports receptive to signals of the third operating mode from the transceiver;
 a first set of power amplifiers for the first operating mode;
 a second set of power amplifiers for the second and third operating modes;
 a first switch selectively interconnecting a one of the first set of transmit ports to a one of the first set of power amplifiers and a one of the second set of power amplifiers;
 a second switch selectively interconnecting a different one of the first set of transmit ports to a different one of the first set of power amplifiers and a different one of the second set of power amplifiers;
 a multi-position switch selectively interconnecting the antenna to a single one of the first set of power amplifiers and the second set of power amplifiers;
 a first set of receive ports relaying signals of the first operating mode and the second operating mode received from the antenna; and
 a second set of receive ports relaying signals of the third operating mode received from the antenna.

2. The front end circuit of claim 1, wherein the multi-position switch further selectively interconnects the antenna to a single one of the first set of receive ports and the second set of receive ports.

3. The front end circuit of claim 1, further comprising:
 diplexers coupling each output of the second set of power amplifiers and each of the second set of receive ports to the antenna.

4. The front end circuit of claim 3, further comprising:
 a first diplexer switch selectively interconnecting one of the output of a first one of the second set of power amplifiers and a first one of the diplexers to the multi-position switch; and
 a second diplexer switch selectively interconnecting the output of a second one of the second set of power amplifiers and a second one of the diplexers to the multi-position switch.

5. The front end circuit of claim 4, wherein the diplexer switches, the first switch, the second switch, and the second set of power amplifiers is fabricated on a single die.

6. The front end circuit of claim 3, further comprising:
a first output switch selectively interconnecting a first one of the second set of power amplifiers to one of the diplexers; and
a second output switch selectively interconnecting a second one of the second set of power amplifiers to an other one of the diplexers;
wherein the first set of power amplifiers are selectively interconnected to the antenna by a respective one of the first and second output switches.

* * * * *